United States Patent [19]
Yoshimori et al.

[11] Patent Number: 6,072,207
[45] Date of Patent: Jun. 6, 2000

[54] PROCESS FOR FABRICATING LAYERED SUPERLATTICE MATERIALS AND MAKING ELECTRONIC DEVICES INCLUDING SAME

[75] Inventors: Hiroyuki Yoshimori, Kanagawa Pref., Japan; Carlos A. Paz De Araujo, Colorado Springs, Colo.; Takeshi Ito, Colorado Springs, Colo.; Michael C. Scott, Colorado Springs, Colo.; Larry D. McMillan, Colorado Springs, Colo.

[73] Assignees: Symetrix Corporation, Colorado Springs, Colo.; Olympus Optical Co., Ltd., Japan

[21] Appl. No.: 08/405,953

[22] Filed: Mar. 17, 1995

Related U.S. Application Data

[63] Continuation-in-part of application No. 08/065,656, May 21, 1993, Pat. No. 5,434,102, which is a continuation-in-part of application No. 07/981,133, Nov. 24, 1992, Pat. No. 5,423,285, and a continuation-in-part of application No. 07/965,190, Oct. 23, 1992, abandoned, which is a continuation-in-part of application No. 07/807,439, Dec. 13, 1991, abandoned, which is a continuation-in-part of application No. 07/660,428, Feb. 25, 1991, abandoned.

[51] Int. Cl.$^7$ ...................................................... H01L 29/12
[52] U.S. Cl. ......................... 257/295; 361/320; 361/321; 361/322; 365/117; 365/145
[58] Field of Search ............................. 257/295; 361/320, 361/321, 322; 365/117, 145

[56] References Cited

U.S. PATENT DOCUMENTS

| | | | |
|---|---|---|---|
| 4,133,778 | 1/1979 | Gray | 252/517 |
| 4,485,180 | 11/1984 | Konoike et al. | 501/135 |
| 5,241,191 | 8/1993 | Agostinelli et al. | 257/35 |
| 5,426,075 | 6/1995 | Perino et al. | 437/235 |
| 5,478,610 | 12/1995 | Desu et al. | 427/573 |
| 5,519,566 | 5/1996 | Perino et al. | 361/321.4 |

OTHER PUBLICATIONS

Döhlev, "Solid–State Superlattices", Scientific American, Nov. 1983, pp. 144–151.

*Primary Examiner*—Valencia Wallace
*Attorney, Agent, or Firm*—Duft, Graziano & Forest, P.C.

[57] ABSTRACT

A liquid precursor containing a metal is applied to a substrate, RTP baked, and annealed to form a layered superlattice material. Special polyoxyalkylated precursor solutions are designed to optimize polarizability of the corresponding metal oxide materials by adding dopants including stoichiometric excess amounts of bismuth and tantalum. The RTP baking process is especially beneficial in optimizing the polarizability of the resultant metal oxide.

11 Claims, 29 Drawing Sheets

| | THICKNESS | 2Pr | 2Ec |
|---|---|---|---|
| Ti | 188 nm | 20.5 $\mu C/cm^2$ | 214 kV/cm |
| $Ti_{0.80}$ $Nb_{0.20}$ | 265 | 24.5 | 139 |
| $Ti_{0.50}$ $Nb_{0.50}$ | 255 | 6.5 | 46 |
| $Ti_{0.33}$ $Nb_{0.67}$ | 255 | 1.9 | 38 |
| $Ti_{0.20}$ $Nb_{0.80}$ | 250 | 1.6 | 46 |
| Nb | 173 | 18.5 | 300 |
| | | | |
| Ti | 188 nm | 20.5 $\mu C/cm^2$ | 214 kV/cm |
| Nb | 173 | 14.6 | 110 |
| | | | |
| $Ti_{0.81}$ $Ta_{0.10}$ $Nb_{0.09}$ | 255 | 24.9 | 131 |
| $Ti_{0.52}$ $Ta_{0.25}$ $Nb_{0.23}$ | 245 | 4.1 | 39 |
| $Ti_{0.35}$ $Ta_{0.34}$ $Nb_{0.31}$ | 235 | 1.0 | 27 |
| $Ti_{0.14}$ $Ta_{0.45}$ $Nb_{0.41}$ | 225 | 4.6 | 110 |
| | | | |
| $Ti_{0.10}$ $Ta_{0.60}$ $Nb_{0.30}$ | 220 | 5.3 | 109 |
| $Ti_{0.10}$ $Ta_{0.80}$ $Nb_{0.10}$ | 215 | 6.7 | 89 |
| $Ti_{0.20}$ $Ta_{0.60}$ $Nb_{0.20}$ | 235 | 2.0 | 58 |

2Pr, 2Ec AT 6 VOLTS, 5kHz

STRONTIUM BISMUTH TANTALATE
POLARIZATION SENSITIVITY TO STRONTIUM CONTENT

HYSTERESIS CURVES OF $Sr_{0.8}Bi_2Ta_2O_{8.8}$

HYSTERESIS CURVES OF $Sr_{0.9}Bi_2Ta_2O_{8.9}$

HYSTERESIS CURVES OF $Sr_{1.1}Bi_2Ta_2O_{9.1}$

HYSTERESIS CURVES OF $Sr_{1.2}Bi_2Ta_2O_{9.2}$

HYSTERESIS CURVES OF $Sr_{1.4}Bi_2Ta_2O_{9.2}$

PROCESS FOR FABRICATING LAYERED SUPERLATTICE MATERIALS AND MAKING ELECTRONIC DEVICES INCLUDING SAME

RELATED APPLICATIONS

This application is a continuation-in-part of U.S. patent application Ser. No. 08/065,656 filed May 21, 1993 (now U.S. Pat. No. 5,434,102), which is a continuation-in-part of U.S. patent application Ser. Nos. 07/981,133 filed Nov. 24, 1992 (now U.S. Pat. No. 5,423,285) and 07/965,190 filed Oct. 23, 1992 which in turn are continuations-in-part of U.S. patent application Ser. No. 07/807,439 filed Dec. 13, 1991, which is a continuation-in-part of U.S. patent application Ser. No. 07/660,428 filed Feb. 25, 1991 (all now abandoned).

BACKGROUND OF THE INVENTION

1. Field of the Invention

The invention in general relates to the fabrication of layered superlattice materials, and more particularly to fabrication processes that provide low fatigue ferroelectric and reliable high dielectric constant integrated circuit devices that are unusually resistant to degradation.

2. Statement of the Problem

Bulk ferroelectric layered perovskite-like superlattice materials are known as phenomenonological curiosities. These materials comprise a broad class of ferroelectrics, and were reported by G. A. Smolenskii, V. A. Isupov, and A. I. Agranovskaya in Chapter 15 of the book, *Ferroelectrics and Related Materials*, ISSN 0275-9608, [V.3 of the series Ferroelectrics and Related Phenomena, 1984] edited by G. A. Smolenskii. As is understood in the art, these materials typically include an oxygen octahedral positioned within a cube formed of A-site metals at the cube corners with the oxygen atoms occupying the planar face-centers of the cube and a B-site metal occupying the center of the cube. These materials have previously not been considered to be useful as thin-film components for integrated circuits due to rapid polarization fatigue in thin-films and the high temperatures that are required to anneal a mixture of powdered superlattice-forming metals into an ordered superlattice.

Rapid thermal processing and furnace annealing in an atmosphere of oxygen are several of many processes that are well-known in the thin-film fabrication technology, See for example, "Process Optimization and Characterization of Device Worthy Sol-Gel Based PZT for Ferroelectric Memories", B. M. Melnick, J. D. Cuchiaro, L. D. McMillan, C. A. Paz De Araujo, and J. F. Scott in *Ferroelectrics*, Vol 109, pp. 1–23 (1990). It is also known to add excess lead in fabricating PZT using a spin-on and annealing process to account for lead lost as lead oxide vapor in the fabrication process. See U.S. Pat. No. 5,028,455 issued to William D. Miller et al. It is also known to add excess $Bi_2O_3$ when fabricating a bismuth titanate thin film using sputtering to compensate for the loss of this component in the sputtering process. See "A New Ferroelectric Memory Device, Metal-Ferroelectric-Semiconductor Transistor", by Shu-Yau Wu, *IEEE Transactions On Electron Devices, August* 1974, pp. 499–504. E. C. Subbarao, in "A Family of Ferroelectric Bismuth Compounds", *J. Phys. Chem. Solids*, V. 23, pp. 665–676 (1962), discloses the creation of solid solutions of some layered superlattice materials and that several of their physical parameters, i.e., the dielectric constant and Curie temperature change as the proportions of the various elements comprising the solid solution change.

Hundreds of processes and parameters can potentially can affect the quality of a ferroelectric material. Those skilled in the art have been searching for more than thirty years to develop ferroelectric materials with properties of extremely low fatigue rates and polarizabilities as high as 25.

SOLUTION TO THE PROBLEM

The present invention solves the above problem by providing a method of fabricating a layered superlattice material having exceptionally high polarizability and low fatigue, as well as layered superlattice materials produced according to this process.

Copending U.S. patent application Ser. No. 07/981,133, describes a method of fabricating layered superlattice thin films that results in electronic properties for these materials several times better than the best previously known. Specifically, the Ser. No. 07/981,133 application teaches that the Smolenskii-type layered superlattice materials are far better suited for ferroelectric and high dielectric constant integrated circuit applications than any prior materials used for these applications. These layered superlattice materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium that spontaneously form layered superlattices, i.e. crystalline lattices that include alternating layers of distinctly different sublattices, such as a ferroelectric and non-ferroelectric sublattices. Generally, each layered superlattice material will include two or more of the above metals; for example, strontium, bismuth and tantalum form the layered superlattice material strontium bismuth tantalate, $SrBi_2Ta_2O_9$. This disclosure provides improvements in the fabrication process that together approximately double the values of the critical ferroelectric parameters, such as the polarizability, over the values obtained with the basic process described in the copending Ser. No. 07/981,133 application.

Broadly speaking, the present invention pertains to materials and methods for fabricating a layered superlattice material. The method includes the steps of providing a substrate and preparing a liquid precursor including a mixture of polyoxyalkylated metal moieties in effective amounts for optimizing an electrical property in layered superlattice materials to be produced from the precursor. The precursor includes a strontium metal moiety, a bismuth metal moiety, and at least one additional metal moiety selected from a group consisting of tantalum, niobium, titanium, zirconium, and mixtures thereof. The method further includes the steps of applying said precursor to the substrate and heating the precursor on the substrate to form a layered superlattice material containing the mixture of metal moieties.

Prebaking the substrate to a temperature above the temperature of the heating step prior to the step of applying the precursor to the substrate is often a key factor in obtaining high performance ferroelectrics.

The mixture of metal moieties in the precursor solution precursor solution preferably reflects a stoichiometric mixture of metals defined by an empirical formula:

$$Sr_w[Bi_{4-2x+\alpha}\{(Ta_y,Nb_{1-y})_x,(Ti_z,Zr_{1-z})_{2-2x}\}_2O_{15-6x}]_c, \quad (1)$$

wherein w, c, x, y, z, and $\alpha$ represent numbers defining stoichiometric portions of formula atoms, $0 \leq x \leq 1.0$, $0 \leq y \leq 1.0$, $0 \leq z \leq 1.0$, $(x-2) \leq \alpha \leq 1.6(2-x)$, $0 \leq w \leq 1.0$, $c \geq 1.0$, and $(c \div w) \geq 1$. In one preferred embodiment, $w \leq 1$, and $c=1$. In another preferred embodiment, $w=1$ and $c \geq 1$. In yet another preferred embodiment, $0.6 \leq w \leq 1.0$ and $c \geq 1$.

These preferred embodiments all reflect the addition of excess bismuth and B-site metals with respect to the Smolenskii formula

$$A_{m-1}Bi_2B_mO_{3m+3}, \qquad (2)$$

wherein A is an A-site metal, B is a B-site metal, O is oxygen, and m is a number equal to at least one.

The departures from the Smolenskii formula are derived from adding dopants to the precursor solutions. Preferred dopants include bismuth and/or tantalum in amounts up to at least about 20 mol % of the empirical formula. An excess bismuth portion ranging from 5% to 10% of the stoichiometrically required amount can be added to the precursor solution for purposes of compensating for anticipated bismuth volatilization losses during the annealing process. In the case of rapid thermal processing, where losses are lower, the dopants can prevent bismuth-induced shorting of the metal oxide materials, thereby expanding the range of A-site metals that may be employed for purposes of increasing polarizability.

An especially preferred embodiment of the present invention includes preparing the precursor solution to reflect a stoichiometric balance of metal moieties defined by the empirical formula

$$Sr_w(Bi_\alpha Ta_2)_y O_z, \qquad (3)$$

wherein w, y, z, and α represent numbers corresponding to stoichiometric portions of formula atoms, $0 \leq w \leq 1.0$, $0 \leq y \leq 1.0$, $2 \leq \alpha \leq 2.2$, $0.6 \leq (w \div y) \leq 1.0$, and z is sufficient to balance the formula charge by providing sufficient oxygen anion to balance the Sr, Bi, and Ta cations. Yet another especially preferred empirical formula is

$$(SrBi_\alpha)_w Ta_y O_z, \qquad (4)$$

wherein w, y, and z represent numbers corresponding to stoichiometric portions of formula substituents, $0 \leq w \leq 1.0$, $0 \leq y \leq 1.0$, $2 \leq \alpha \leq 2.2$, $2 \leq y/w$, and z is sufficient to balance the charge formula charge by providing sufficient oxygen anion to balance the Sr, Bi, and Ta cations.

The heating or annealing step preferably includes a step of rapid thermal processing the precursor in an oxygen atmosphere to a target maximum temperature ranging from about 500° C. and about 850° C., and more preferably ranging from 675° C. to 825° C. Even more preferably, the heating step includes ramping a temperature of the precursor at a rate between 1° C. per second and 200° C. per second, and holding the precursor film at a target temperature and holding it at the target temperature for from 5 seconds to 300 seconds. A step of furnace annealing the substrate may be conducted subsequent to the rapid thermal processing step. The furnace anneal is most preferably conducted at a temperature ranging from about 700° C. to about 850° C.

The method can include additional steps, such as forming a ferroelectric capacitor including the layered superlattice material between two electrodes, patterning the device, and subsequently performing a further anneal.

The precursor can be manufactured with selected ingredients for optimizing the polarizability of a given type of layered superlattice material, e.g., strontium bismuth tantalate materials. The first step of the optimization method includes the steps of selecting a primary precursor liquid including a combination of metal moieties in effective amounts for yielding a layered superlattice material having a first empirical formula providing a first level of electronic performance. The metal moieties at least include a bismuth moiety, an A-site metal moiety, and a B-site metal moiety. A series of secondary precursor liquids are formulated by varying a relative proportion of at least one of the metal moieties with respect to the first empirical formula. A plurality of representative metal oxide materials are produced from each of the primary and secondary precursor liquids. An electrical property is measured in each of the representative metal oxide materials. An optimal content of precursor ingredients is identified through a comparison of the electrical measurements. The electronic properties may also include one or more properties selected from the group consisting of polarizability, coercive field, leakage current, dielectric constant, and fatigue. The elements that form the solid solution may include elements selected from the group comprising tantalum, niobium, titanium, zirconium and many other elements. Electronic performance can also be optimized by conducting a sensitivity analysis based upon the effects of process parameters such as anneal temperature, anneal time, thermal ramping rates, drying of the precursor prior to the anneal, and prebaking of the substrate.

The preferred process results in a layered superlattice material having an average grain size of from 20 to 200 nm. As compared to the prior art, the process reduces the grain size of the material while reducing the distribution of grain sizes, thus improving the crystallinity of the film. At the same time the process shortens the fabrication time, since the material reaches high values of 2Pr with shorter furnace anneal time.

The methods described above result in layered superlattice materials having excellent electronic properties. For example, ferroelectric layered superlattice materials with polarizabilities, 2Pr, higher than 25 microcoulombs per square centimeter have been fabricated. Numerous other features, objects and advantages of the invention will become apparent from the following description when read in conjunction with the accompanying drawings.

BRIEF DESCRIPTION OF THE DRAWINGS

FIG. 11 shows graphs of 2Pr and 2Ec for samples comprising different solid solutions of strontium bismuth tantalate and strontium bismuth niobate;

DESCRIPTION OF THE PREFERRED EMBODIMENT

1. Overview

Figure 2:
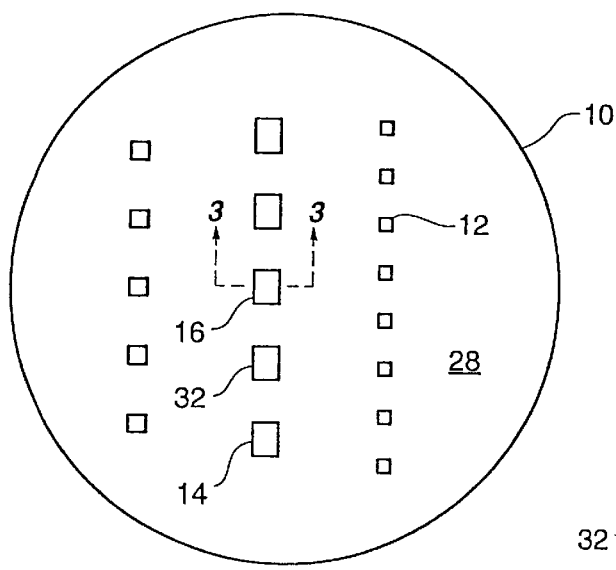
FIG. 2 is a top view of a wafer on which thin film capacitors fabricated by the process according to the invention are shown greatly enlarged.
Figure 3:
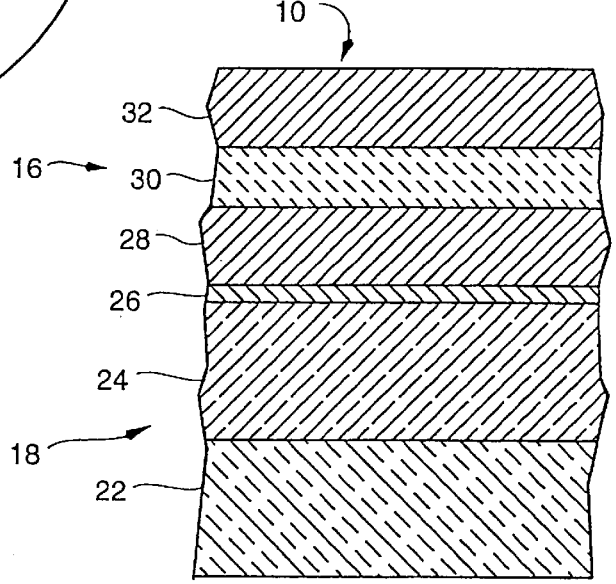
FIG. 3 is a portion of a cross-section of FIG. 2 taken through the lines 3—3, illustrating a thin film capacitor device fabricated by the process according to the invention.

Directing attention to FIGS. 2 and 3, a wafer 10 containing numerous capacitors 12, 14, 16 etc. is shown. FIG. 2 is a top view of the wafer 10 on which the thin film capacitors 12, 14, 16 etc. fabricated by the process according to the invention are shown greatly enlarged. FIG. 3 is a portion of a cross-section of FIG. 2 taken through the lines 3—3 bisecting capacitor 16. Referring to FIG. 3, the wafer 10 includes a silicon substrate 22, a silicon dioxide insulating layer 24, a thin layer of titanium 26 which assists adhesion of the next layer, which is a platinum electrode 28, in adhering to the silicon dioxide 24, a layer of layered superlattice material 30, and another platinum electrode 32. After the layers 24, 26, 28, 30, and 32, are deposited, the wafer is etched down to layer 28 to form the individual capacitors 12, 14, 16, etc. which are interconnected by the bottom electrode 28.

The present invention primarily involves the method of creating the layer 30 of layered superlattice material. As mentioned above, these layered superlattice materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium that spontaneously form layered superlattices, i.e. crystalline lattices that include alternating layers of distinctly different sublattices. Generally each layered superlattice material will include two or more of the above metals; for example, barium, bismuth and niobium form the layered superlattice material barium bismuth niobate, $BaBi_2Nb_2O_9$. The material 30 may be a dielectric, a ferroelectric, or both. If it is a dielectric, the capacitor 16 is a dielectric capacitor, and if the material 30 is a ferroelectric, then capacitor 16 is a ferroelectric capacitor The layered superlattice materials may be summarized more generally under the formula:

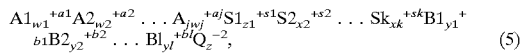

$$A1_{w1}^{+a1} A2_{w2}^{+a2} \ldots A_{jwj}^{+aj} S1_{z1}^{+s1} S2_{x2}^{+s2} \ldots Sk_{xk}^{+sk} B1_{y1}^{+b1} B2_{y2}^{+b2} \ldots Bl_{yl}^{+bl} Q_z^{-2}, \quad (5)$$

where A1, A2 . . . Aj represent A-site elements in the perovskite-like structure, which may be elements such as strontium, calcium, barium, bismuth, lead, and others S1, S2 . . . Sk represent super-lattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in Formula (5) indicate the valences of the respective elements, and the subscripts indicate the number of moles of the material in a mole of the compound, or in terms of the unit cell, the number of atoms of the element, on the average, in the unit cell. The subscripts can be integer or fractional. That is, Formula (5) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (5) is written in the more general form since the invention is intended to include the cases where either of the sites and the superlattice generator can have multiple elements. The value of z is found from the equation:

$$(a1w1+a2W2 \ldots +ajwj)+(z1x1+x2x2 \ldots +skxk)+(b1y1+b2y2 \ldots +bjyj)=2z. \quad (2)$$

Formula (5) includes all three of the Smolenskii type compounds. The layered superlattice materials do not include every material that can be fit into the Formula (5), but only those which spontaneously form themselves into crystalline structures with distinct alternating layers. It should be noted that the x, y, and z symbols in the Formula (5) should not be confused with the x, y, and z, symbols used in the Formulas (6) and (7) below. The Formula (5) is a general formula for layered superlattice materials, while the Formulae (6) and (7) are formulae for solid solutions of particular layered superlattice materials.

It should also be understood that the term layered superlattice material herein also includes doped layered superlattice materials. That is, any of the material included in Formula (5) may be doped with a variety of materials, such as silicon, germanium, uranium, zirconium, tin or hafnium. For example, strontium bismuth tantalate may be doped with a variety of elements as given by the formula:

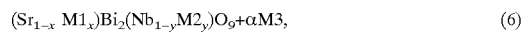

$$(Sr_{1-x} M1_x)Bi_2(Nb_{1-y}M2_y)O_9+\alpha M3, \quad (6)$$

where M1 may be Ca, Ba, Mg, or Pb, M2 may be Ta, Bi, or Sb, with x and y being a number between 0 and 1 and preferably $0 \leq x \leq 0.2$, $0 \leq y \leq 0.2$, M3 may be Si, Ge, U, Zr, Sn, or Hf, and preferably $0 \leq \alpha \leq 0.05$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

$$(1-x) SrBi_2Ta_2O_9+xABO_3, \quad (7)$$

where A may be Bi, Sr, Ca, Mg, Pb, Y, Ba, Sn, and Ln; B may be Ti, Zr, Hf, Mn, Ni, Fe, and Co; and x is a number between 0 and 1, preferably, $0 \leq x \leq 0.2$.

Likewise the layered superlattice material may be modified by both a minor $ABO_3$ component and a dopant. For example, a material according to the formula:

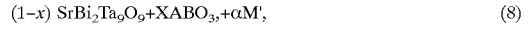

$$(1-x) SrBi_2Ta_9O_9+XABO_3,+\alpha M', \quad (8)$$

where A may be Bi, Sb, Y and Ln; B may be Nb, Ta, and Bi; M' may be Si, Ge, U, Ti, Sn, and Zr; and x is a number between 0 and 1, preferably, $0 \leq x \leq 0.2$, is contemplated by the invention.

Figure 4:
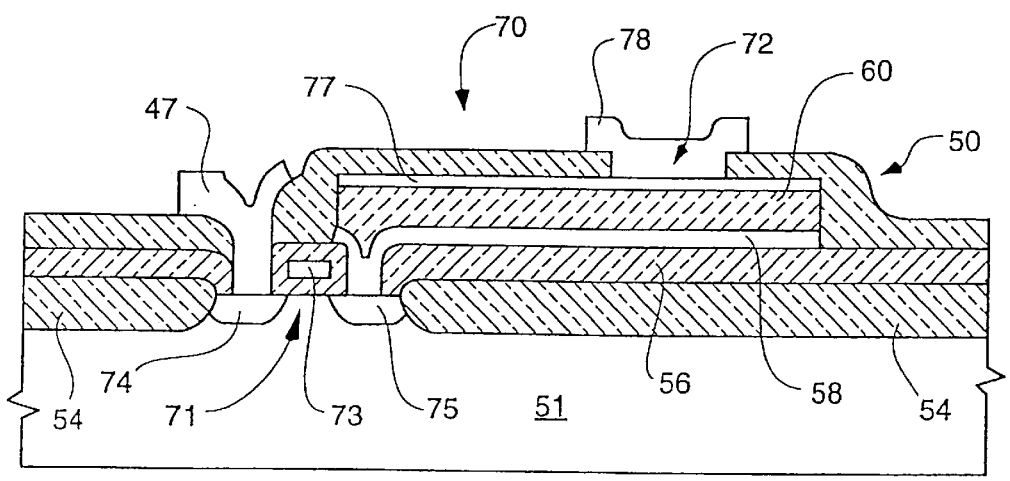
FIG. 4 is a cross-sectional illustration of a portion of an integrated circuit fabricated utilizing the process of, the invention.

FIG. 4 shows an example of the integration of a layered superlattice capacitor 72 into a DRAM memory cell to form an integrated circuit 70 such as may be fabricated using the invention. The memory cell 50 includes a silicon substrate 51, field oxide areas 54, and two electrically interconnected electrical devices, a transistor 71 and a ferroelectric switching capacitor 72. Transistor 71 includes a gate 73, a source 74, and a drain 75. Capacitor 72 includes first electrode 58, ferroelectric layered superlattice material 60, and second electrode 77. Insulators, such as 56, separate the devices 71, 72, except where drain 75 of transistor 71 is connected to first electrode 58 of capacitor 72. Electrical contacts, such as 47 and 78 make electrical connection to the devices 71, 72 to other parts of the integrated circuit 70. A detailed example of the complete fabrication process for an integrated circuit memory cell as shown in FIG. 4 is given in U.S. patent application Ser. No. 07/919,186, which is incorporated herein by reference. It should be understood that FIGS. 2, 3, 4 depicting the capacitors 12, 14, 16 etc. and integrated circuit 70 are not meant to be actual cross-sectional views of any particular portion of an actual electronic device, but are merely idealized representations which are employed to more clearly and fully depict the structure and process of the invention than would otherwise be possible.

This disclosure describes the fabrication and testing of numerous capacitors 12, 14, 16 having layers 22, 24, 26, 28, 30, and 32 made of the materials above, disclosing a wide spectrum of variations of the fabrication process according to the invention and a variety of different layered superlattice materials 30. It then discloses how this data is used to design and manufacture electronic devices utilizing layered superlattice materials. It should be understood, however, that the specific processes and electronic devices described are exemplary, i.e., the invention contemplates that the layers in FIGS. 3 and 4 may be made of many other materials than those mentioned above and described below, there are many other variations of the process of the invention than can be included in a document such at this, and the method and materials may be used in many other electronic devices other than the capacitors, such as 12, 14, 16 etc. and the integrated circuit 70. It should also be noted that the word "substrate" is used in both a specific and a general sense in this disclosure. In the specific sense it refers to the specific silicon layer 22, conventionally called a silicon substrate, on which the exemplary electronic devices described are fabricated. In a general sense, it refers to any material, object, or layer on which another layer or layers are formed. In this sense, for example, the layers 22, 24, 26, and 28 comprise a substrate 18 for the layer 30 of layered superlattice material 30.

A term that is used frequently in this disclosure is "stoichiometry" or "stoichiometric". As used herein, the term stoichiometric generally expresses a relationship between the precursor solution and the final layered superlattice film 30. A "stoichiometric precursor" is one in which the relative proportions of the various metals in the precursor is the same as the proportion in a homogeneous specimen of the intended final layered superlattice thin film 30. This proportion is the one specified by the formula for the final thin film 30.

2. Detailed Description of the Fabrication Process

Figure 1:
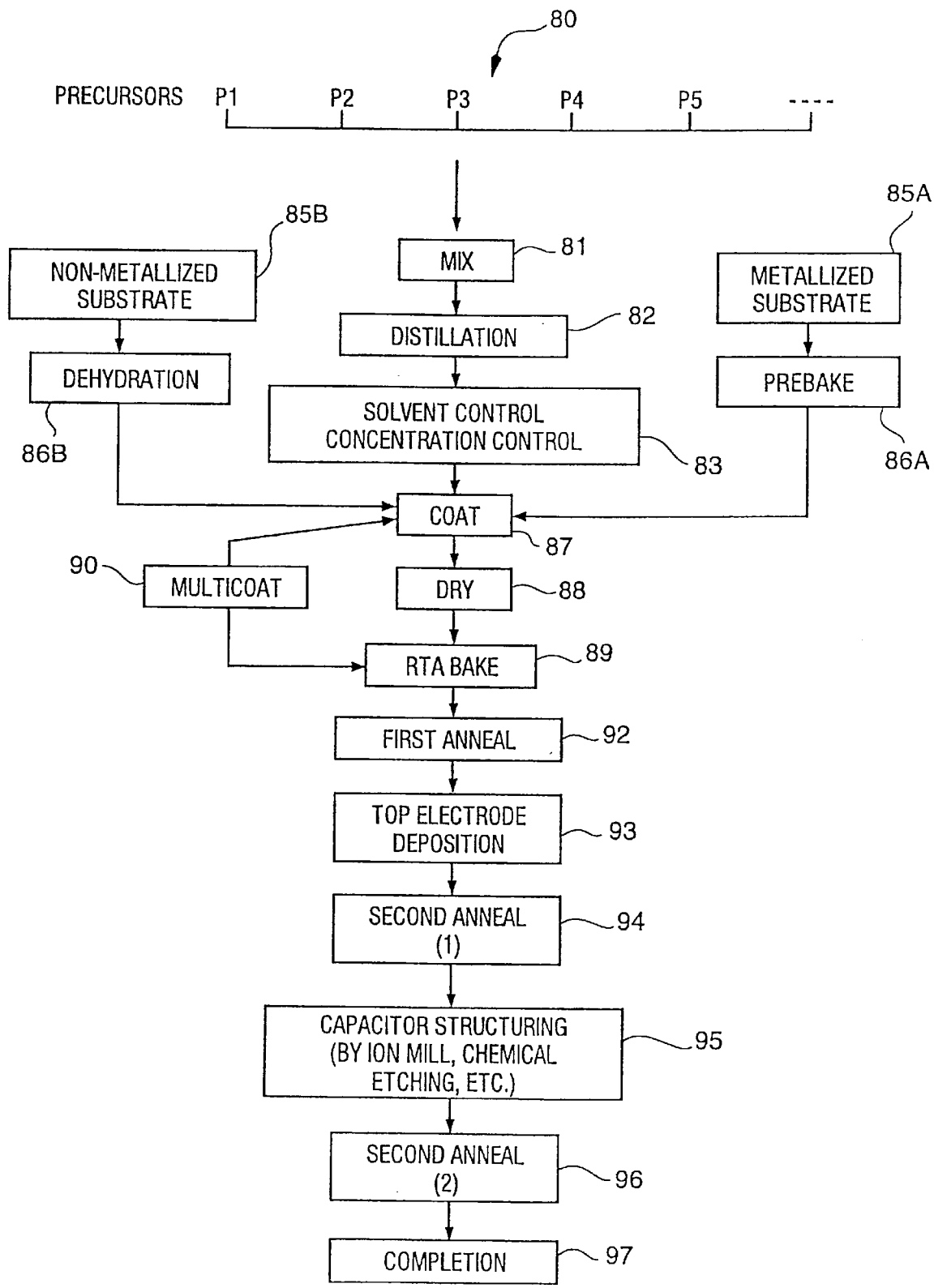
FIG. 1 is a flow chart showing the preferred embodiment of a process for preparing a thin film of a layered superlattice material according to the invention.

Turning now to a more detailed description of the invention, a flow chart of the preferred embodiment of a process according to the invention for preparing a thin film of a layered superlattice material, such as 30 and 60, and a device, such as 10 and 70 incorporating the material 30 and 60, is shown in FIG. 1. We shall first review each step of the preferred process briefly, and then discuss the individual steps in more detail and provide examples of the process. The first step 80 of the process is the preparation of the precursor or precursors, P1, P2, P3, etc. In the preferred embodiment the precursors are liquids in which a compound or compounds of the metals to comprise the layered superlattice material 30 are dissolved. The precursors are then mixed in step 81, and the mixed precursors are distilled in step 82. Then follows a solvent control and/or concentration control step 83. Generally this step is taken over two stages which may be separated considerably in time. In the first stage the mixed precursor is dissolved in a suitable solvent and concentrated so as to provide a long shelve life. Just before use, the solvent and concentration may be adjusted to optimize the electronic device that results from the process.

In parallel with the solvent and concentration control step 83, the substrate 18 is prepared. If the substrate is a metallized substrate, such as the substrate 18, then the substrate is provided in step 85A by forming the layers 22, 24, 26, and 28 and is then prebaked in step 86A. If the substrate is a non-metallized substrate, such as a silicon or gallium arsenide single crystal, the substrate is provided in step 85B and dehydrated in step 86B. In step 87 the substrate is coated with the precursor. In the examples discussed below, the coating was done by a spin-on process, though a process such as a misted deposition process as described in U.S. patent application Ser. No. 07/993,380, which is hereby incorporated by reference, or dipping or other suitable coating process may be used. The coated substrate is then dried in step 88, and the baked in an RTP (rapid thermal processor) unit. If the desired thickness of the layer 30 is not obtained, then the series of coat, dry, and RTP bake steps 87, 88, and 89 are repeated as many times as required to build up the desired thickness. The wafer 10 is then annealed in step 92, the top or second electrode 32 is deposited in step 93 by sputtering or other suitable process, and the wafer 10 is then annealed, again in step 94. The capacitor 16 is then structured by ion milling, chemical etching, or other suitable process in step 95. Then follows a third anneal in step 96. This completes the process if a capacitor device as in FIG. 2 is the desired end result, however in the case of an integrated circuit as in FIG. 4, there follows completion steps 97 such as contact metalization, capping, etc. As will be discussed further below, not all of the steps outlined above are necessary for every device: some steps are optional and others are used only for certain layered superlattice materials.

The preferred precursors solutions and their preparation in step 80 are discussed in detail in U.S. patent application Ser. No. 07/981,133 which is hereby incorporated herein by reference. Generally a metal or a metal compound is reacted with a carboxylic acid, such as 2-ethylhexanoic acid, to produce a metal hexanoate, which is dissolved in a suitable solvent or solvents, such as xylenes. Other metal-organic acid esters in addition to the 2-ethylhexanotates that may for suitable precursors when compounded with a metal are the acetates and acetylacetonates. For some metals, such as titanium, the precursor metal compound may comprise a metal alkoxide, such as titanium 2-methoxyethoxide. Other alkoxides that may be compounded with a metal and used as precursor compounds include the methoxides, ethoxides, n-propoxide, iso-propoxides, n-butoxides, iso-butoxides, tert-butoxides, 2-methoxyethoxides, and 2-ethoexyethoxides. The precursor metal compound is preferably dissolved in a solvent having a boiling point greater than the boiling point of water, i.e. 100° C. A xylenes solvent works for most metals. For highly electropositive elements, the solvent preferably includes 2-methoxyethanol or n-butyl acetate. Some solvents that may be used, together with their boiling points, include: alcohols, such as 1-butanol (117° C.), 1-pentanol (117° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones, such as 2-hexanone (methyl butyl ketone) (127° C.), 4-methyl-2-pentanone (methyl isobutyl ketone) (118° C.), 3-heptanone (butyl ethyl ketone) (123° C.), and cyclohexanone (156° C.); esters, such as butyl acetate (127° C.), 2-methoxyethyl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.–143° C.), toluene (111° C.) and ethylbenzene (136° C.).

The metal carboxylate may be further reacted with an alkoxide to form a metallic alkoxycarboxylate, which is particularly preferred for use in precursor solutions. This preference exists because at least about 50% of the metal to oxygen bonds that will exist in the final superlattice material are believed to be formed in the precursor. Accordingly, crystalline materials formed from a liquid deposition process utilizing these precursors exhibit superior electrical performance characteristics due to enhanced crystalline properties.

The precursors of the individual metals may be made separately and then mixed, but generally they are all made together in the same container and mixed as they are made. After mixing, the precursor solution may be distilled to remove water and other undesirable impurities and by-products of the preparation process, although if the precursors and solvents are available in pure enough states, the distillation step 81 may be skipped. Distillation preferably occurs to a solution temperature of at least 115° C., more preferably to at least 120° C., and most preferably to at least about 123° C. Distillation induces the elimination of reaction byproducts and drives various endothermic reactions to substantial completeness, e.g., the polyoxyalkylated metal portion preferably includes a fraction having the molecular formula:

$$(R'\text{—COO—})_a M(\text{—O—R})_n, \qquad (9)$$

or $$(R'\text{—C—O—})_a M(\text{—O—M'}(\text{—O—C—R''})_{b-1})_n, \qquad (10)$$

wherein M is a metal having an outer valence of (a+n) and M' is a metal having an outer valence of b, with M and M' preferably being selected from the group consisting of tantalum, calcium, bismuth, lead, yttrium, scandium, lanthanum, antimony, chromium, thallium, hafnium, tungsten, niobium, zirconium, manganese, iron, cobalt, nickel, magnesium, molybdenum, strontium, barium, titanium, vanadium, and zinc; R and R' are respective alkyl groups preferably having from 4 to 9 carbon atoms and R'' is an alkyl group preferably having from 3 to 8 carbon atoms. The latter formula, which has a central —O—M—O—M'—O— structure, is particularly preferred due to the formation in solution of at least 50% of the metal to oxygen bonds that will exist in the final solid metal oxide product. Similar —M—O— M'—O— structures are obtainable from reactions between metal alkoxycarboxylates and respective metal alkoxide or metal carboxylate reagents.

Exemplary chemical reactions that are useful in producing the above products include $$\text{alkoxides—} M^{+n} + n\ R\text{—OH} \rightarrow M(O\text{—R})_n + n/2\ H_2 \qquad (11)$$

$$\text{carboxylates—} M^{+n} + n\ (R\text{—COOH}) \rightarrow M(OOC\text{—R})_n + n/2\ H_2 \qquad (12)$$

$$\text{alkoxycarboxylates—} M(O\text{—R'})_n + b\ R\text{—COOH} + \text{heat} \rightarrow (R'\text{—O})_{n-b} M(OOC\text{—R})_b + b\ HOR, \qquad (13)$$

where M is a metal cation having a charge of n; b is a number of moles of carboxylic acid ranging from 0 to n; R' is preferably an alkyl group having from 4 to 15 carbon atoms and R is preferably an alkyl group having from 3 to 9 carbon atoms. According to a generalized reaction theory, if a metal-alkoxide is added to the metal-alkoxycarboxylate, and the solution is heated, the following reactions occur:

$$(R\text{—COO—})_x\text{—M—}(O\text{—C—R'})_a + M'(\text{—O—C—R''})_b \rightarrow (R\text{—COO—})_x\text{—M—}(O\text{—M'}(\text{—O—C—R''})_{b-1})_a + a\ R'\text{—O—C—R''} \qquad (14)$$

$$(R\text{—COO—})_x M(\text{—O—C—R'})_a + x\ M'(\text{—O—C—R''})_b \rightarrow (R'\text{—C—O—})_a\text{—M—}(\text{—O—M'}(\text{—O—C—R''})_{b-1})_x + x\ R\text{—COO—C—R''} \qquad (15)$$

where M and M' are metals; R and R' are defined above; R'' is an alkyl group preferably having from about zero to sixteen carbons; and a, b, and x are integers denoting relative quantities of corresponding substituents corresponding to the respective valence states of M and M'. Generally the reaction of Equation (14) will predominate. Thus, ethers having low boiling points are generally formed. These ethers boil out of the pre-precursor to leave a final product having a reduced organic content and the metal-oxygen-metal bonds of the final desired metal oxide already partially formed. If the heating is sufficient, some of the reaction (15) will also occur, creating metal-oxygen-metal bonds and esters. Esters generally have higher boiling points and remain in solution. These high boiling point organics slow down the drying process after the final precursor is applied to a substrate, which tends to reduce cracking and defects; thus, in either case, metal-oxygen-metal bonds are formed and the final precursor performance is improved.

If a metal-carboxylate is added to the metal-alkoxycarboxylate and the mixture is heated, the following reaction occurs:

$$(R\text{—COO})_x\text{—M—}(O\text{—C—R'})_a + x\ M'\text{—}(OOC\text{—R''})_b \rightarrow (R'\text{—C—O})_a\text{—M—}(O\text{—M'—}(OOC\text{—R''})_{b-1})_x + x\ R\text{—COOOC—R'} \qquad (16)$$

where R—COOOC—R' is an acid anhydride, and the terms are as defined above. This reaction requires considerably more heat than do the reactions (14) and (15) above, and proceeds at a much slower rate. The reaction products of equations (11)–(16) can be heated with excess carboxylic acid to substitute carboxylate ligands for alkoxide ligands, thereby reducing the hydrolyzing ability of the carboxylated products and increasing precursor shelf life.

The solvent type and concentration may then be adjusted in step 83 either to prepare it for coating, if the coating is to be done immediately, or to provide a precursor with a long shelf life. If the solvent control steps are such as to prepare a solution with a long shelf life, then just before coating, another adjustment will usually be done to optimize the thin film. Some adjustments to produce a long shelf life and to produce high quality films are discussed in detail in U.S. patent application Ser. No. 07/981,133. It is a feature of the present invention that it has been found that while a single solvent precursor, such as the precursors with xylenes as the solvent described in the prior application, may have a long shelf life, adding a second solvent, or a plurality of solvents immediately prior to coating results in much higher quality thin films.

It has been found that a single solvent often cannot be found that has the optimum solubility, viscosity, and boiling point. The solubility of the metal compound in the solvent determines whether or not fine precipitates occur; the viscosity determines the smoothness of the coating process, and the boiling point determines how fast the solvent vaporizes in the drying process, which effects whether defects appear during the drying. To optimize all the desirable properties, in the preferred embodiment one or more additional solvents are added, and the concentration adjusted, usually by distilling, just prior to coating. Utilizing the boiling point information given above, a solvent with a higher boiling point may be added to retard the overall drying process, or a solvent with a lower boiling point may be added to speed up the drying process. N-butyl acetate may be added to increase the solubility. For example, when n-butyl acetate is added as a third solvent, to a precursor that contains both xylenes and 2-methoxyethanol, preferably in a ratio of approximately 50% xylenes, 20% methoxylethanol, and 30% n-butyl acetate, the resulting thin films have a more even surface and have fewer cracks, spats, and less precipitation of microparticles. Since methoxyethanol is not a good solvent for metal esters such as 2-ethylhexanotes, a recommended solvent for these materials is 50% xylenes and 50% n-butyl acetate. The improvement is especially significant when strontium is one of the metals in the precursor. Generally, solvents with a boiling point above 200° C. are not suitable, even if they have good solubility, because the high evaporation temperature and low vapor pressure are not compatible with the spin-on and drying processes used in the preferred embodiment of the invention. The addition of ethylene glycol and formamide as evaporation speed control additives has also been found to be effective to control the cracking problem.

In steps 85A and 86A, or steps 85B and 86B, a substrate is provided and prepared for coating. Almost any substrate that will support a thin film and is compatible with the materials and processes described herein may be used. Some of these substrates include oxidized or non-oxidized silicon or gallium arsenide semiconducting wafers, with or without integrated circuits and/or metalized layers added, plates of silicon or glass, and other electronic device chips. For the exemplary devices of this disclosure, the substrates were metalized substrates 18 as shown in FIG. 3. The fabrication of the substrate 18 is described in detail in prior application Ser. No. 07/981,133 referred to above, and will not be repeated herein. While platinum with a titanium adhesion layer is the metalization used in the examples discussed, numerous other metals may be used such as platinum with an adhesion layer of tantalum, tungsten, molybdenum, chromium, nickel or alloys of these metals, and titanium nitride. Sputtering or vacuum deposition are the preferred deposition processes, though other metalization processes may be used. Heating of the substrates during the metalization deposition is effective to increase adhesion. It has been found that prebaking of the metalized substrate at a temperature that is higher than or equal to the temperature of any of the subsequent processes performed on the wafer 10, which processes are described below, is usually necessary to optimize the electronic properties of the thin film 30. The prebaking step 86A comprises baking in an oxygen atmosphere, preferably with an oxygen content of between 500° C. and 1000° C. prior to the coating step 87. Preferably the wafer 10 is baked in a diffusion furnace. The substrate prebake step 86A removes water and organic impurities from the substrate surface. More importantly, the prebaking decreases the internal stress of the metal layer 28 through the annealing effect of the prebaking and the partial oxidation and interdiffusion of the adhesion layer 26 metal. All this increases the adhesion between the substrate 18 and the layered superlattice film 30 and minimizes the peeling problem. Further, if the adhesion layer 26 is a transition metal, the partial oxidation stabilizes the metal chemically. Therefore the number of mobile atoms penetrating into the layered superlattice layer 30 through the platinum layer 28 is drastically decreased, and the layered superlattice layer 30 crystallizes smoothly without defects due to the diffused ions. If the substrate is not metallized, then the silicon or other wafer is dehydrated at a lower temperature.

The precursor mixing, distillation, solvent control, and concentration control steps 81, 82, and 83 have been discussed separately and linearly for clarity. However, these steps can be combined and/or ordered differently depending on the particular liquids used, whether one intends to store the precursor or use it immediately, etc. For example, distillation is usually part of solvent concentration control, as well as being useful for removing unwanted by-products, and thus both functions are often done together. As another example, mixing and solvent control often share the same physical operation, such as adding particular reactants and solvents to the precursor solution in a predetermined order. As a third example, any of these steps of mixing, distilling, and solvent and concentration control may be repeated several times during the total process of preparing a precursor.

The mixed, distilled, and adjusted precursor solution is then coated on the substrate 18. Preferably the coating is done by a spin-on process. The preferred precursor solution concentration ranges from about 0.01 to 0.50 M (moles/liter) of the empirical formula having subscripts normalized by proportional adjustment to a value of $Bi_2$). The preferred spin speed ranges from 500 rpm to 5000 rpm.

The spin-on process and the misted deposition process remove some of the solvent, but some solvent remains after the coating. This solvent is removed from the wet film in a drying step 88. At the same time, the heating causes thermal decomposition of the organic elements in the thin film, which also vaporize and are removed from the thin film. This results in a solid thin film of the layered superlattice material 30 in a precrystallized amorphous state. This dried film is sufficiently rigid to support the next spin-on coat. The drying temperature must be above the boiling point of the solvent, and preferably above the thermal decomposition temperature of the organics in precursor solution. The preferred drying temperature is between 150° C. and 400° C. and depends on the specific precursor used. The drying step may comprise a single drying step at a single temperature, or multiple step drying process at several different temperatures, such as a ramping up and down of temperature. The multiple step drying process is useful to prevent cracking and bubbling of the thin film which can occur due to excessive volume shrinkage by too rapid temperature rise. An electric hot plate is preferably used to perform the drying step 88.

The drying step 88 is optionally followed by an RTP bake step 89. Radiation from a halogen lamp, and infrared lamp, or an ultraviolet lamp provides the source of heat for the RTP bake step. In the examples, an AG Associates model 410 Heat Pulser utilizing a halogen source was used. Preferably, the RTP bake is performed in an oxygen atmosphere of between 20% and 100% oxygen, at a temperature between 500° C. and 850° C., with a ramping rate between 1° C./sec and 200° C./sec, and with a holding time of 5 seconds to 300 seconds. Any residual organics are burned out and vaporized during the RTP process. At the same time, the rapid temperature rise of the RTP bake promotes nucleation, i.e. the generation of numerous small crystalline grains of the layered superlattice material in the solid film 30. These grains act as nuclei upon which further crystallization can occur. The presence of oxygen in the bake process is essential in forming these grains.

The thickness of a single coat, via the spin process or otherwise, is very important to prevent cracking due to volume shrinkage during the following heating steps 88, 89, and 92. To obtain a crack-free film, a single spin-coat layer must be less than 2000 Å after the bake step 89. Therefore, multiple coating is necessary to achieve film thicknesses greater than 2000 Å. The preferred film fabrication process includes RTP baking for each spin-on coat. That is, as shown in FIG. 1, the substrate 18 is coated, dried, and RTP baked, and then the process 90 is repeated as often as necessary to achieve the desired thickness. However, the RTP bake step is not essential for every coat. One RTP bake step for every two coats is practical, and even just one RTP bake step at the end of a series of coats is strongly effective in improving the electronic properties of most layered superlattice ferroelectrics. For a limited number of specific precursor/layered superlattice material compositions, particularly ones utilizing concentrations of bismuth in excess of stoichiometry, the RTP bake step 89 is not necessary.

Once the desired film thickness has been obtained, the dried and preferably baked film is annealed in step 92, which is referred to as a first anneal to distinguish it from subsequent anneals. The first anneal is preferably performed in an oxygen atmosphere in a furnace. The oxygen concentration is preferably 20% to 100%, and the temperature is above the crystallization temperature of the particular layered superlattice material 30. Generally, for the materials of the invention, this temperature is above 700° C. To prevent evaporation of elements from the layered superlattice material 30 and to prevent thermal damage to the substrate, including damage to integrated circuits already in place, the annealing temperature is preferably kept below 850° C. Preferably the annealing for strontium bismuth tantalate is done at about 800° C. for 30 to 90 minutes, and is in a similar range for most other layered superlattice materials. Again, the presence of oxygen is important in this first anneal step. The numerous nuclei, small grains generated by the RTP bake step, grow, and a well-crystallized ferroelectric film is formed under the oxygen-rich atmosphere.

After the first anneal, the second or top electrode 32 is formed. Preferably the electrode is formed by RF sputtering of a platinum single layer, but it also may be formed by DC sputtering, ion beam sputtering, vacuum deposition or other appropriate deposition process. If desirable for the electronic device design, before the metal deposition, the layered superlattice material 30 may be patterned using conventional photolithography and etching, and the top electrode 32 is then patterned in a second process after deposition. In the examples described herein, the top electrode 32 and layered superlattice material 30 are patterned together using conventional photolithography techniques and ion beam milling.

As deposited, the adhesion of the top electrode 32 to the layered superlattice material is usually weak. Preferably, the adhesion is improved by a heat treatment. The wafer 10 including the layered superlattice film 30 covered by the top electrode 32 may be annealed before the patterning step 95 described above in a heat treatment designated in FIG. 1 as the second anneal (1) step 94, after the patterning step 95 by a heat treatment designated in FIG. 1 as the second anneal (2) step 96, or both before and after the patterning step 95. The second anneal is preferably performed in an electric furnace at a temperature between 500° C. and the first anneal temperature. A second anneal below 500° C. does not improve the adhesion of electrode 32, and the resulting capacitor devices are sometimes extremely leaky, and shorted in the worst cases.

The second anneal releases the internal stress in the top electrode 32 and in the interface between the electrode 32 and the layered superlattice material 30. At the same time, the second annealing step 94, 96 reconstructs microstructure in the layered superlattice material 30 resulting from the sputtering of the top electrode, and as a result improves the properties of the material. The effect is the same whether the second anneal is performed before or after the patterning step 95. The effect of oxygen ambient during the second anneal is not as clear as it is in the case of RTP bake 89 and the first anneal 92, because the layered superlattice material 30 is covered by the top electrode and not exposed to the ambient atmosphere. With regard to most electrical properties, inert gas, such as helium, argon, and nitrogen may be used with approximately the same result as with oxygen. However, it has been found that an oxygen atmosphere during the second anneal improves the crystallographic order at the interface of the electrode 32 and layered superlattice material 30 as well as the symmetry of the hysteresis curve.

3. Examples of the Fabrication Process and Property Dependence

Figure 5:
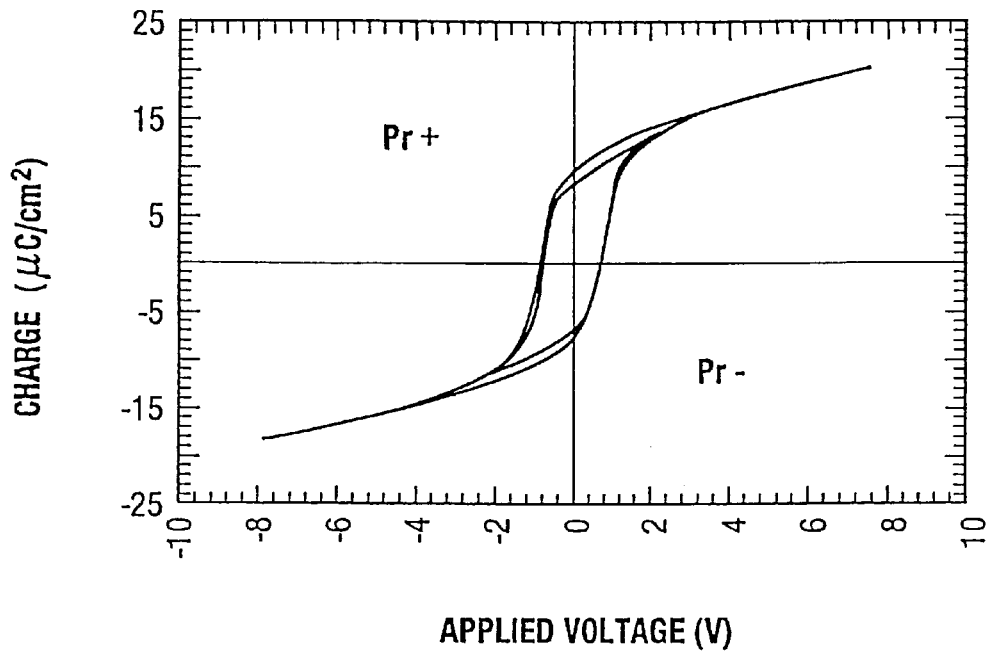
FIG. 5 shows hysteresis curves at ±2, ±4, ±6 and ±8 volts for a sample of SrBi$_2$Ta$_2$O$_9$ having 10% excess bismuth and fabricated according to the invention.
Figure 11:
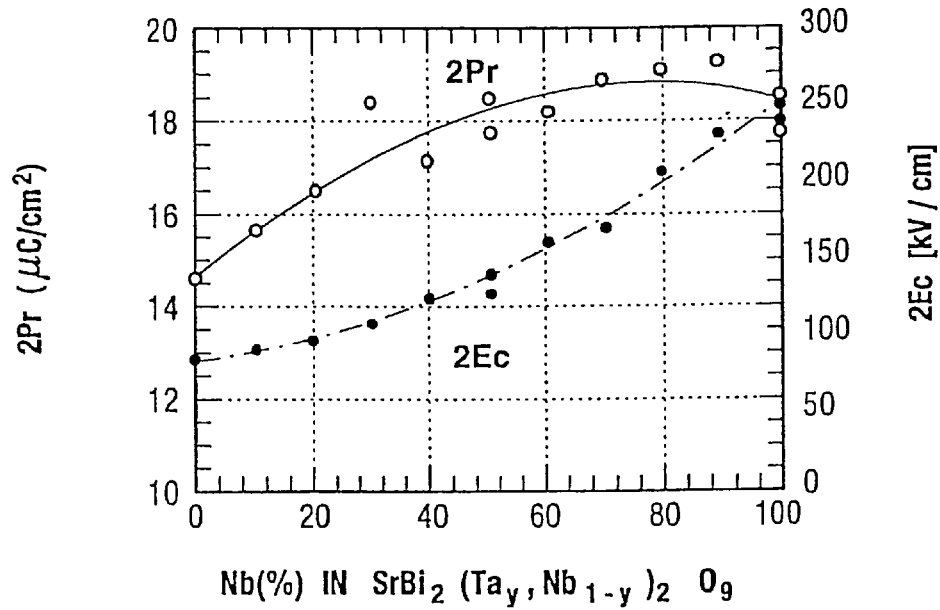
FIG. 11 shows hysteresis curves at 2, 4, and 6 volts for samples comprising different solid solutions of strontium bismuth tantalate and strontium bismuth niobate.

Below, examples of the fabrication process according to the invention as applied to a wafer 10 as shown in FIGS. 2 and 3 are given. Following each of the examples, there is a discussion of the electrical/electronic properties illustrated in the figures. The figures include hysteresis curves, such as FIG. 5, and material endurance or "fatigue" curves such as FIG. 6. The hysteresis curves are given in terms of either the applied voltage in volts, as for example in FIG. 5, or the electric field in kilovolts per centimeter, as for example in FIG. 7, versus the polarization charge in microcoulombs per centimeter squared. Generally, the hysteresis is shown for three different voltages (or fields) generally, 2 volts, 4 volts, and 6 volts. As is well-known, hysteresis curves which suggest good ferroelectric properties tend to be relatively boxy and long in the direction of polarization, rather than thin and linear. The hysteresis measurements were all made on an uncompensated Sawyer-Tower circuit unless otherwise noted. The endurance or "fatigue" curves give the polarization charge, 2Pr, in microcoulombs per square centimeter versus the number of cycles. The polarization charge 2Pr is the charge created by switching a capacitor such as 16 from a state where it is fully polarized in one direction, say the upward vertical direction in FIG. 3, to the opposite fully polarized state, which would be the downward vertical direction in FIG. 3. Here, by "fully polarized" means the state in which the ferroelectric material has been polarized fully and the field removed. In terms of an hysteresis curve, such as shown in FIG. 5, it is the difference between $Pr_+$, the point where the hysteresis curve crosses the positive polarization axis (y-axis), and $Pr_-$, the point where the hysteresis curve crosses the negative polarization axis. Unless otherwise noted, the 2Pr value is taken from the hysteresis measurement at the highest voltage. The higher the value of 2Pr, the better will be the performance of the material in ferroelectric memories and other applications. A cycle is defined as the capacitor, such as 16, being switched through one square pulse. This polarization, 2Pr, is approximately twice the remnant polarization, Pr. Other figures, such as FIG. 11, also show the value 2Ec, which is given in kilovolts per cm, versus some other parameter, such as the amount of bismuth in the stoichiometry (FIG. 11). The parameter 2Ec is equal to the sum of the coercive field on the positive side, Ec+, and the coercive field on the negative side, Ec−, upon a voltage change, generally taken as from −6 to +6 volts for the figures shown. The coercive field is a measure of the size of the field that is required to switch the material from one polarization state to another. For a practical electronic device, it should be high enough that stray fields will not cause polarization switching, but if it is too high, large voltages will be required to operate the device. Other parameters and terms used in the figures and discussion should be clear from the context.

EXAMPLE 1

Formation of a Strontium Bismuth Tantalate Ferroelectric Capacitor

A wafer 10 including a number of capacitors 12, 24, 16, etc. was fabricated in which the layered superlattice material 30 was strontium bismuth tantalate ($SrBi_2Ta_2O_9$). The precursor solution comprised strontium 2-ethylhexanoate, bismuth 2-ethylhexanoate, and tantalum 2-ethylhexanoate in a xylenes solvent. The plural "xylenes" is used instead of the singular "xylene", because commercially available xylene includes three different fractionations of xylene. The three metal 2-ethylhexanoates were mixed in a proportion such that the strontium and tantalum were present in the mixed precursor in stoichiometric proportions, while the bismuth was present in 110% of stoichiometry. The molarity of the solution was approximately 0.2 moles per liter. The precursor was diluted to 0.13 moles per liter by the addition of n-butyl acetate. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of 6 liters/min. An eyedropper was used to place 1 ml of the $SrBi_2Ta_2O_9$ precursor solution on the substrate 18. The wafer was spun at 1500 RPM for 40 seconds. The wafer 10 was then placed on a hot plate and baked in air at about 170° C. for 5 minutes and then at 250° C. for another 5 minutes. The wafer 10 was then RTP baked at 725° C. with a ramping rate of 125° C./sec, a hold time of 30 seconds, a natural cool time of 6 minutes, and an ambient oxygen flow of approximately 100–200 cc/minute. The steps from using an eyedropper to deposit solution on the wafer through RTP baking were repeated for another coat. The wafer was then transferred to a diffusion furnace and annealed at 800° C. in an oxygen flow of 6 l/min for 60 minutes. The top layer 32 of 2000 Å platinum was sputtered, a resist was applied, followed by a standard photo mask process, an ion mill etch, an IPC strip and a second anneal at 800° C. in an oxygen flow of about 6 l/min for 30 minutes. The final thickness of the layered superlattice film 30 was 2000 Å.

Figure 6:
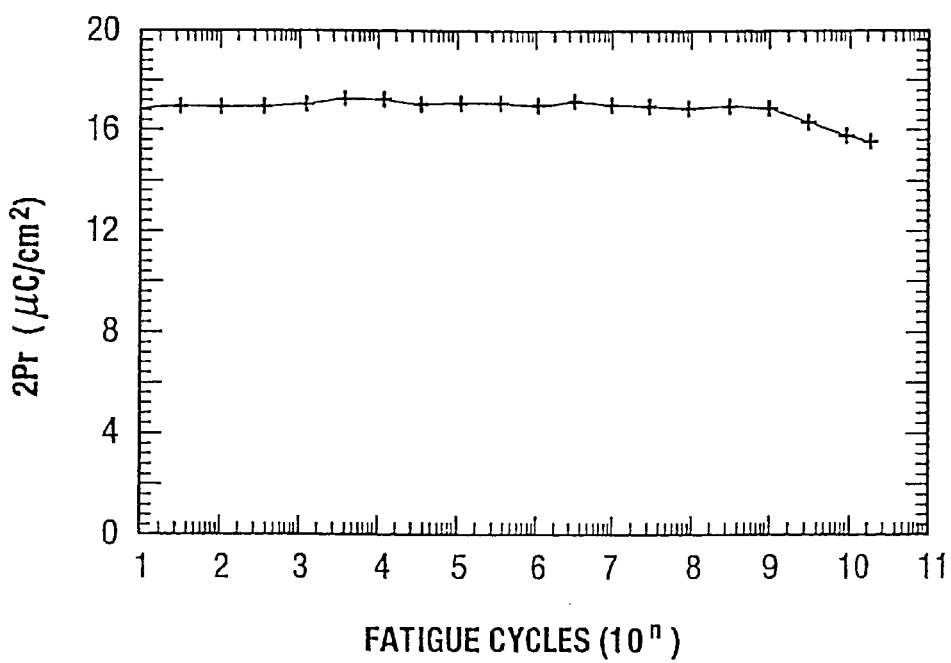
FIG. 6 is a graph of 2Pr versus number of cycles for the sample of FIG. 5 illustrating the excellent resistance to fatigue of the material according to the invention.

FIG. 5 shows initial hysteresis curves for the $SrBi_2Ta_2O_9$ sample fabricated in Example 1 measured at FIG. 6 is a graph of 2Pr versus number of cycles for the sample of FIG. 5 taken from a series of 20 hysteresis curves such as those of FIG. 5; this may be referred to as an endurance or "fatigue" curve as it demonstrates the decline in 2Pr, which may be interpreted as the amount of fatigue of the material, over the number of cycles switched. FIG. 6, shows that the fatigue over $2 \times 10^{10}\%$ v amplitude sine wave cycles is less than 10%. Moreover the value of 2Pr is about 17 $\mu C/cm$ 2.

The basic process for making low-fatigue layered superlattice materials and devices utilizing such materials, as discussed and claimed in the copending U.S. patent application Ser. No. 07/981,133, results in similar excellent low-fatigue results as shown in FIGS. 4 and 5. In both the materials made according to the basic process of the prior disclosure and the materials made with the added improvements of the present disclosure, the coercive field is such that electronic devices that operate in the range of 2 to 10 volts, the standard range for integrated circuits, are possible. With the improved process of the present disclosure, polarizabilities in the range of 15 $\mu C/cm^2$ to more than 25 $\mu C/cm^2$ are possible, while keeping the same excellent resistance to fatigue and excellent coercive field size.

EXAMPLE 2

Control of Electronic Properties by Varying the Bismuth Content

The effect of excess bismuth content on the properties of strontium bismuth tantalate was studied utilizing various bismuth concentrations in the precursor solutions that yielded corresponding strontium bismuth tantalate layered superlattice material. This variation overcame the problem of the long annealing time required to reach the maximum 2Pr for the excess bismuth samples. By controlling the bismuth content of the precursor, one can control the electronic properties, such as 2Pr, 2Ec, and the resistance to fatigue. This feature of the invention leads to the ability to design precursor solutions corresponding to optimized electronic performance in the resultant metal oxide materials.

A series of ten wafers 10 including a number of capacitors 12, 24, 16, etc. was fabricated in which the layered superlattice material 30 was strontium bismuth tantalate ($SrBi_2Ta_2O_9$). The precursor solution comprised strontium 2-ethylhexanoate, bismuth 2-ethylhexanoate, and tantalum 2-ethylhexanoate in a xylenes solvent. The three metal 2-ethylhexanoates were mixed in a proportion such that the strontium and tantalum were present in the mixed precursor in stoichiometric proportions, while the bismuth was present in the following proportions different percentage of stoichiometry for each of the ten wafers: 50%; 80%; 95%; 100%; 105%; 110%; 120%; 130%; 140%; and 150% of the stoichiometrically required amount of Formula (1) (i.e., $Bi_2$). The molarity of the solution was approximately 0.09 moles per liter. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of 6 liters/min. An eyedropper was used to place 1 ml of the $SrBi_2Ta_2O_9$ precursor solution on the substrate 18. The wafer was spun at 2000 RPM for 40 seconds. The wafer 10 was then placed on a hot plate and baked in air at about 180° C. for 5 minutes and then at 250° C. for another 5 minutes. The wafer 10 was then RTP baked at 725° C. with a ramping rate of 125° C./sec, a hold time of 30 seconds, a natural cool time of 6 minutes, and an ambient oxygen flow of about 100–200 cc/minute. The steps from using an eyedropper to depositing solution on the wafer through RTP baking were repeated for another coat. The wafer was then transferred to a diffusion furnace and annealed at 800° C. in an oxygen flow of 6 l/min for 30 minutes. The top layer 32 of 2000 Å platinum was sputtered, a resist was applied, followed by a standard photo mask process, an ion mill etch, an IPC strip and a second anneal at 800° C. in an oxygen flow of 6 l/min for 30 minutes. The final thickness of the layered superlattice film 30 was 1900 Å to 2100 Å.

Figure 7:
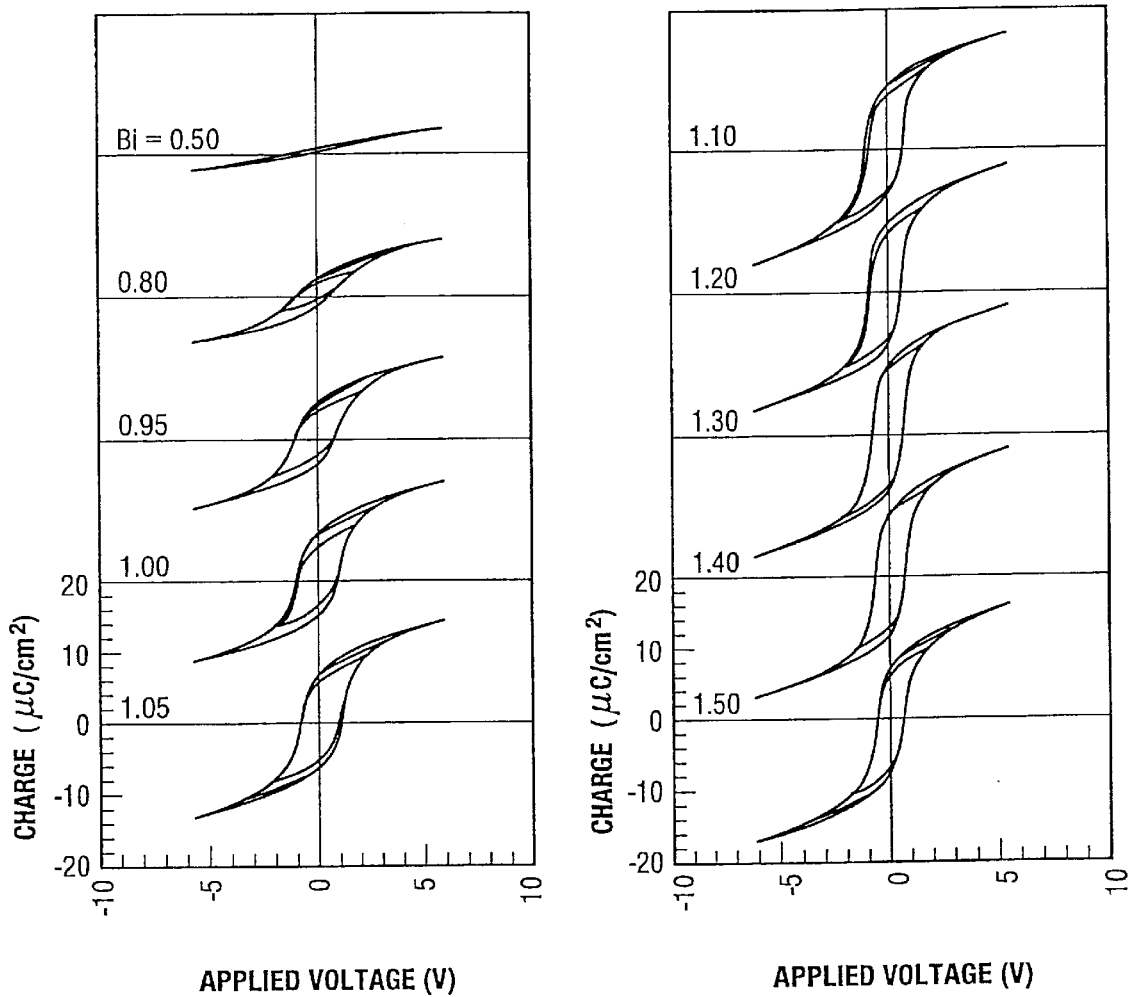
FIG. 7 shows the hysteresis curves at 2, 4, and 6 volts for samples of strontium bismuth tantalate fabricated utilizing precursor solutions having different bismuth content.

FIG. 7 depicts polarization hysteresis curves for each of the ten samples made according to the process of Example 2, and includes a plot of charge in $\mu C/cm^2$ versus applied voltage for each sample. The Y-axis scale is proportional to a charge range of −20 to 20 $\mu C/cm^2$ for each hysteresis loop. As indicated above, all samples were prepared with an RTP bake at about 725° C. The best curve separations occurred for bismuth factors ranging from 0.95 to 1.2, or 95% to 120% of the stoichiometric bismuth amount. The best polarizations were obtained from samples having bismuth factors ranging from about 1.10 to 1.40.

Figure 8:
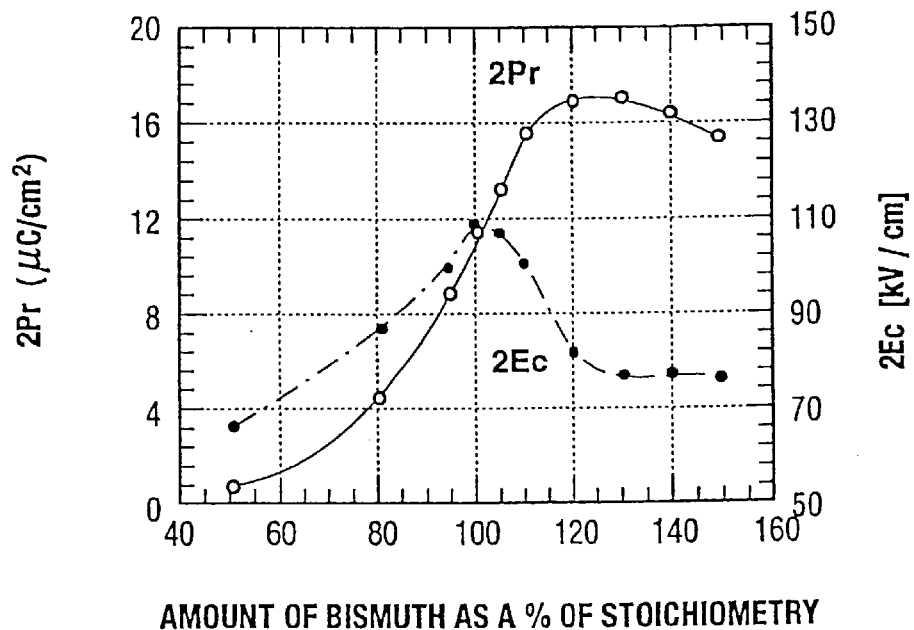
FIG. 8 shows graphs of 2Pr and 2Ec for the 6 volt hysteresis curves of FIG. 10.
Figure 9:
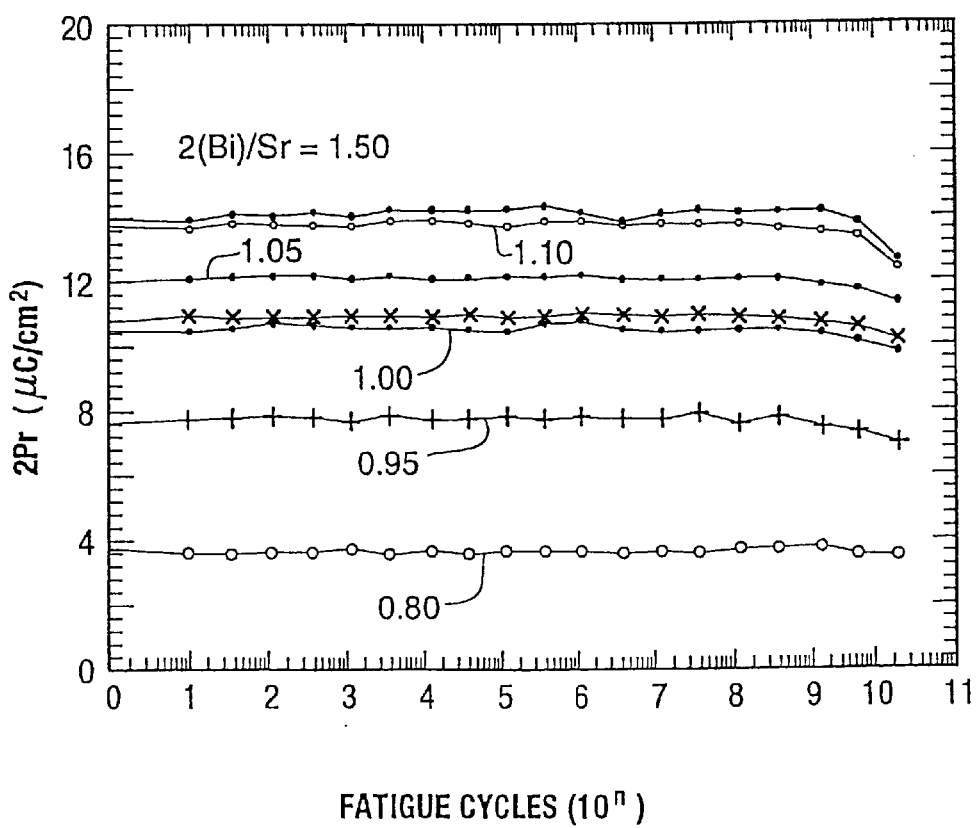
FIG. 9 shows graphs of 2Pr versus number of cycles for the samples of FIG. 10.

FIG. 8 depicts values of 2Pr and 2Ec at 6V corresponding to the hysteresis curves of FIG. 7. FIG. 8 shows that the material is clearly ferroelectric above 50% of bismuth stoichiometry. As the amount of bismuth increases, so does 2Pr and 2Ec. At about 100% of stoichiometry, 2Ec peaks and then decreases steadily until it becomes relatively flat at about 130% of stoichiometry. 2Pr peaks at about 120% to 130% of stoichiometry [$\alpha$=0.4 in the formula (3) or (4)] and then decreases gradually. The upper limit of bismuth concentration is defined by the electrical shorting of the thin film due to the degradation of film quality caused by excessive grain growth or migration of excess bismuth FIG. 9 depicts fatigue endurance results for the respective samples of Example 2. All of the samples show excellent resistance to fatigue. Fatigue resistance, accordingly, does not depend on the bismuth content as long as the material is ferroelectric. These curves were obtained by repeqatedly polarizing the respective samples with a sine wave having an amplitude of 5.7V.

The manufacturing and performance improvement principles of films having excess bismuth are also applicable to other elements which form high vapor pressure compounds during fabrication of layered superlattice materials. In addition to bismuth, other such elements include lead, thallium and antimony.

4. Dependence of Electronic Properties on the Elements Comprising the Layered Superlattice Material In this section various solid solutions of strontium bismuth tantalate, strontium bismuth niobate, strontium bismuth titanate, and strontium bismuth zirconate shall be discussed. To shorten the technical description and make the figures easier to read, strontium bismuth tantalate will sometimes be referred to as tantalate or abbreviated as Ta, strontium bismuth niobate will sometimes be referred to as niobate or abbreviated as Nb, strontium bismuth titanate will sometimes be referred to as titanate or abbreviated as Ti, and strontium bismuth zirconate will sometimes be referred to as zirconate or abbreviated as Zr. This designation should always be clear from the context. This method of designating the layered superlattice materials helps illuminate the utility of the methods of the invention for designing electronic devices.

In the following example, layered superlattice materials comprising a solid solution of strontium bismuth tantalate (Ta) and strontium bismuth niobate (Nb) were investigated.

EXAMPLE 3

Strontium Bismuth Tantalum Niobate (TaNb)

A series of wafers 10 including a number of capacitors 12, 24, 16, etc. was fabricated in which the layered superlattice material 30 was strontium bismuth tantalum niobate, i.e.,

$$SrBi_2(Ta_y,Nb_{1-y})_2O_9, \quad (17)$$

wherein y ranges from 0 to 1.

A variety of respective solid solutions of Ta and Nb were fabricated according to Formula (17). The precursor solution comprised strontium 2-ethylhexanoate, bismuth 2-ethylhexanoate, tantalum 2-ethylhexanoate and niobium 2-ethylhexanoate in a xylenes solvent. The four metal 2-ethylhexanoates were mixed in a proportion such that the strontium, bismuth, tantalum, and niobium were present in the mixed precursor in stoichiometric proportions, with y having a progression of values from 0 to 1. The molarity of the solution was approximately 0.10 moles per liter. No dilution with a second solvent was performed. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of about 6 liters/min. An eyedropper was used to place 1 ml of the $[SrBi_2(Ta_y,Nb_{1-y})_2O_9]$ precursor solution on the substrate 18. The wafer was spun at 1500 RPM for 40 seconds. The wafer 10 was then placed on a hot plate and baked in air at about 180° C. for 5 minutes and then at 250° C. for another 5 minutes. The wafer 10 was then RTP baked at 725° C. with a ramping rate of 125° C./sec, a hold time of 30 seconds, a natural cool time of 6 minutes, and an ambient oxygen flow of 100 to 200 cc/minute. The steps from using an eyedropper to deposit solution on the wafer through RTP baking were repeated for another coat. The wafer was then transferred to a diffusion furnace and annealed at 800° C. in an oxygen flow of 6 l/min for 60 minutes. The top layer 32 of 2000 Å platinum was sputtered, a resist was applied, followed by a standard photo mask process, an ion mill etch, an IPC strip and a second anneal at 800° C. in an oxygen flow of 6 l/min for 30 minutes. The final thickness of the films 30 ranged between 1400 Å and 2100 Å, depending on the sample.

Figure 10:
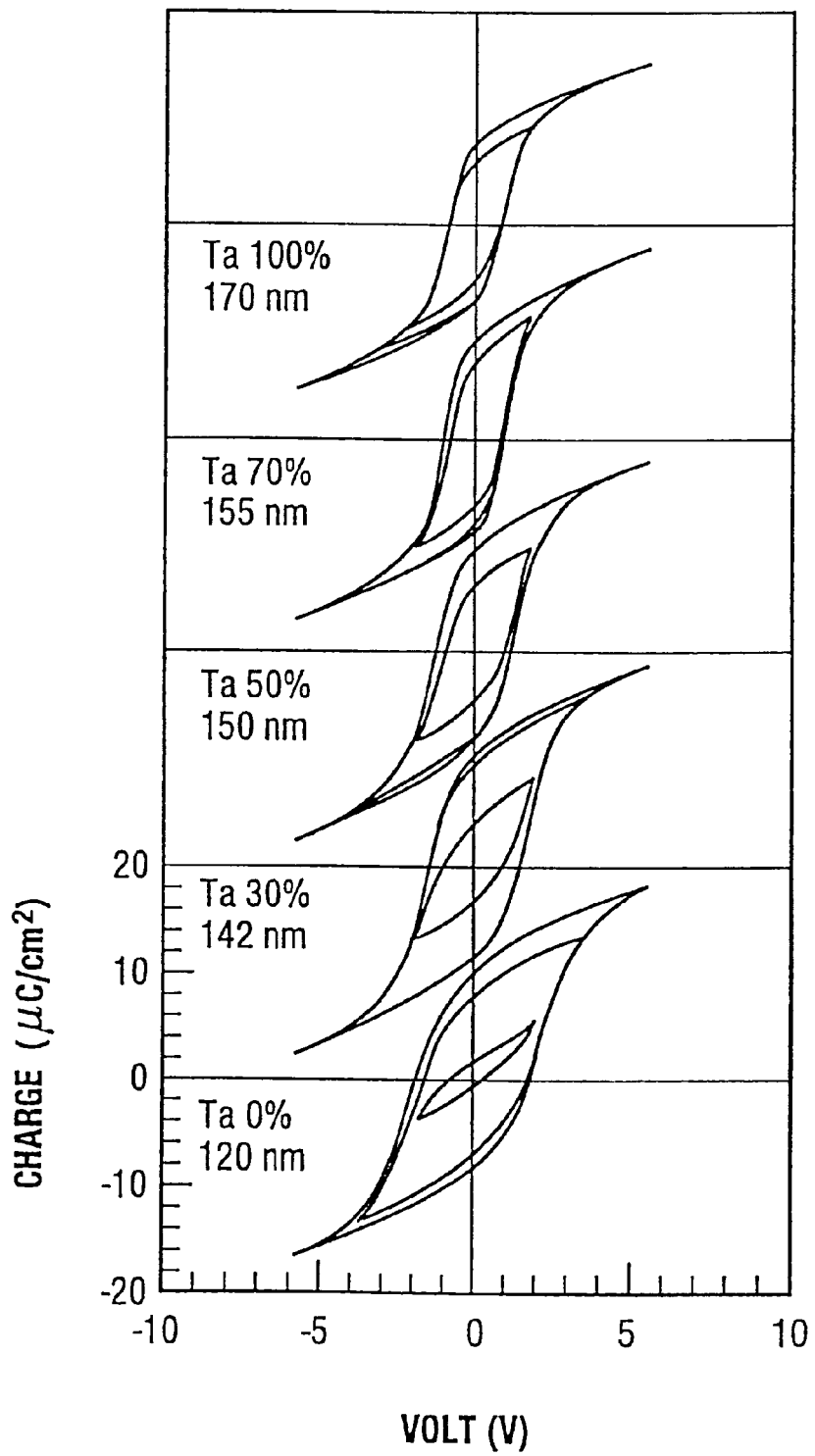
FIG. 10 shows graphs of 2Pr and 2Ec versus first anneal temperature for samples of strontium bismuth tantalate.

FIG. 10 depicts polarization hysteresis curves for five samples of strontium bismuth tantalum niobate (TaNb) having the following y values (Formula (17)) in terms of Ta percentage: 100% ($SrBi_2Ta_2O_9$); 70%; 50%; 30%; and 0% ($SrBi_2Nb_2O_9$). The Y-axis scale for each curve extends over a range between −20 and 20 $\mu C/cm^2$. The voltages at which the hysteresis curves were taken were 2, 4, and 6 volts as before.

Figure 12:
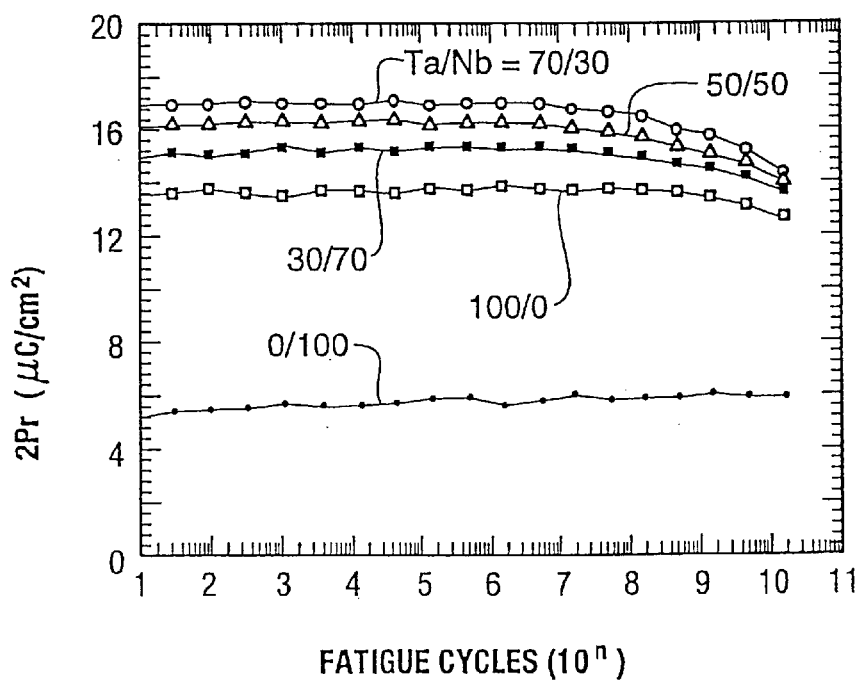
FIG. 12 shows graphs of 2Pr versus number of cycles for samples comprising different solid solutions of strontium bismuth tantalate and strontium bismuth niobate.

FIG. 11 is a plot of 2Pr and 2Ec versus the percentage of Nb, as compared to Ta, in Formula (17), with 2Pr and 2Ec being measured as before from ±6 volt hysteresis curves. The X-axis represents a value of (1−y). The substitution of niobium for the tantalum caused both 2Pr and 2Ec to increase dramatically. FIG. 12 shows the fatigue curves out to $2 \times 10^{10}$ cycles for five different samples of TaNb with five different ratios of Ta to Nb. The samples were fatigued at 300 kV/cm and the hysteresis curves from which the data for the fatigue curves were taken were performed at 250 Kv/cm. It is further noted that if the same molarity is used for precursor solutions, the viscosity of the solutions changes with the Ta/Nb ratio, with the Ta precursor being more viscous than the Nb precursor. As a result the final thickness of the 100% Ta films is approximately twice as thick as the 100% Nb films. Further, Ta enriched films tend to saturate their hysteresis at a lower voltage than Nb enriched films. Thus the values of 2Pr in FIG. 19 for the various ratios differ from those in FIG. 11. The resistance to fatigue is excellent for all samples. However, the large coercive field for samples with a high percentage of Nb would result in devices requiring large voltages to operate. Therefore, in view of practical electronic device applications, an amount of tantalum in $SrBi_2(Ta_y,Nb_{1-y})_2O_9$ with y between 0.5 and 1.0 is recommended.

In the crystalline structure of strontium bismuth niobate, niobium has the same valence and almost the same ionic radii as tantalum in strontium bismuth tantalate. Thus, tantalum and niobium can substitute for one another in the crystal structure without restriction. All of the resulting materials are excellent ferroelectrics. The next example illustrates the result when two layered superlattice materials with significantly different crystal structure are mixed in solid solution.

EXAMPLE 4

Strontium Bismuth Tantalum Titanate (TiTa)

A series of wafers 10 including a number of capacitors 12, 24, 16, etc. was fabricated in which the layered superlattice material 30 was strontium bismuth tantalum titanate,

$$SrBi_{4-2y}(Ta_y,Ti_{2-2y})_2O_{15-6y}, \quad (18)$$

wherein y ranges from 0 to 1. Respective samples containing a solid solution of Ti and Ta were fabricated with different y values. The precursor solution comprised strontium 2-ethylhexanoate, bismuth 2-ethylhexanoate, tantalum 2-ethylhexanoate and titanium 2-ethylhexanoate in a xylenes solvent. The four metal 2-ethylhexanoates were mixed in a proportion such that the strontium, bismuth, tantalum, and titanium were present in the mixed precursor in stoichiometric proportions, with y taking on a series of values from 0 to 1. The molarity of the solution was approximately 0.07 moles per liter. No dilution with a second solvent was performed. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of 6 liters/min. An eyedropper was used to place 1 ml of Formula (18) precursor solution on the substrate 18. The wafer was spun at 1500 RPM for 40 seconds. The wafer 10 was then placed on a hot plate and baked in air at about 180° C. for 5 minutes and then at 250° C. for another 5 minutes. The wafer 10 was then RTP baked at 725° C. with a ramping rate of 125° C./sec, a hold time of 30 seconds, a natural cool time of 6 minutes, and an ambient oxygen flow of 100–200 cc/minute. The steps from using an eyedropper to deposit solution on the wafer through RTP baking were repeated for three coats. The wafer was then transferred to a diffusion furnace and annealed at 800° C. in an oxygen flow of 6 l/min for 30 minutes. The top layer 32 of 2000 Å platinum was sputtered, a resist was applied, followed by a standard photo mask process, an ion mill etch, an IPC strip and a second anneal at 800° C. in an oxygen flow of 6 l/min for 30 minutes. The final thickness of the layered superlattice films 30 ranged between 2000 Å and 3500 Å, depending on the sample.

Figure 13:
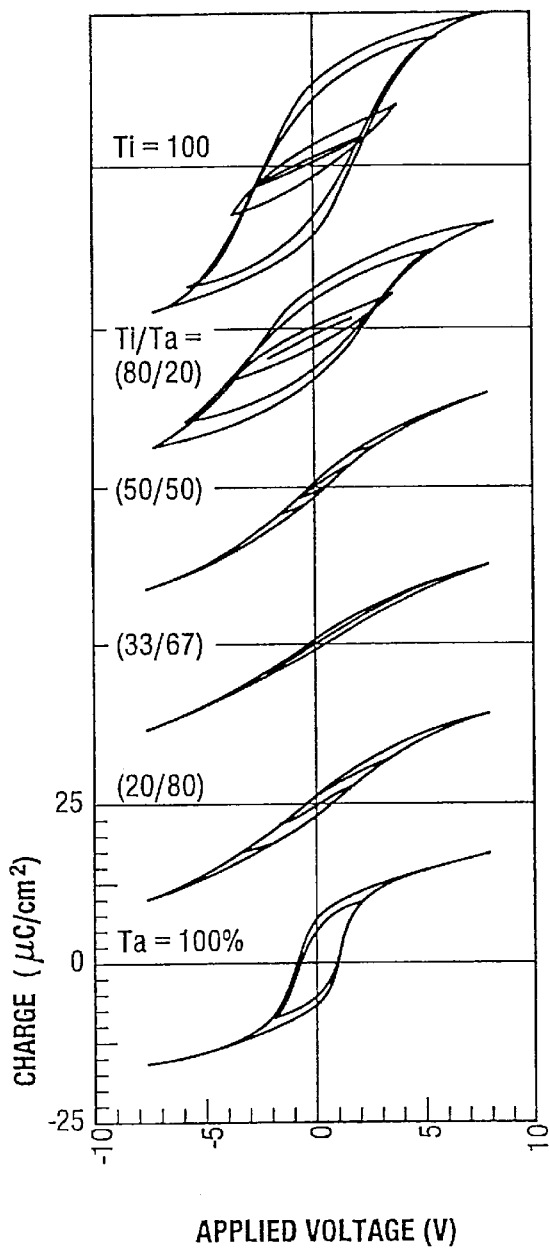
FIG. 13 shows hysteresis curves at 2, 4, 6, and 8 volts for samples comprising different solid solutions of strontium bismuth titanate and strontium bismuth tantalate.

FIG. 13 depicts polarization hysteresis curves for six different samples that were produced according to Formula (18), i.e., y values indicating the following percentages of Ti: 100% ($SrBi_4Ti_4O_{15}$); 80%; 50%; 33%; 20%; and 0% ($SrBi_2Ta_2O_9$). The voltages at which the hysteresis curves were run was 2, 4, and 6 volts as before. The Y-axis scale represents a range of from −25 to 25 $\mu C/cm^2$ for each hysteresis curve. In this instance, while both the strontium bismuth titanate and the strontium bismuth tantalate are excellent ferroelectrics, solid solutions of the two near 50/50 ratios are not. Moreover a broad range of ferroelectric properties, such as values of 2Pr and 2Ec are represented near the two extremes of the solid solutions.

EXAMPLE 5

Strontium Bismuth Niobium Titanate (TiNb)

Another series of wafers 10 including a number of capacitors 12, 24, 16, etc. was fabricated in which the layered superlattice material 30 was strontium bismuth niobium titanate

$$SrBi_{4-2z}(Nb_z Ti_{2-2z})_2 O_{15-6z},\qquad(19)$$

wheerein z ranges from 0 to 1. Respective samples were prepared according to Formula (19). The precursor comprised strontium 2-ethylhexanoate, bismuth 2-ethylhexanoate, niobium 2-ethylhexanoate and titanium 2-ethylhexanoate in a xylenes solvent. The four metal 2-ethylhexanoates were mixed in a proportion such that the strontium, bismuth, niobium and titanium were present in the mixed precursor in stoichiometric proportions, with z taking on a series of values from 0 to 1. The molarity of the solution was approximately in the range 0.07 moles per liter to 0.09 moles per liter depending on the sample. Otherwise the fabrication process was the same as for Example 4 above. The final thickness of the film 30 was between 2200 Å and 2650 Å depending on the sample.

Figure 14:
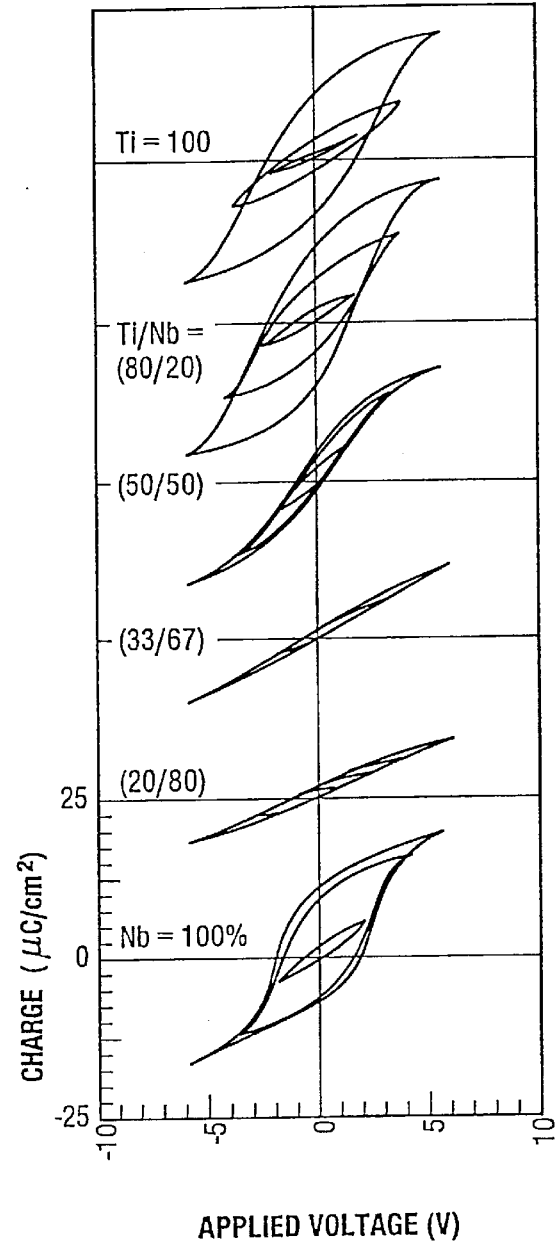
FIG. 14 shows hysteresis curves at 2, 4, and 6 volts for samples comprising different solid solutions of strontium bismuth titanate and strontium bismuth niobate.

FIG. 14 depicts polarization hysteresis curves for six different samples of strontium bismuth niobium titanate (TiNb) having various z-value percentages of Ti according to Formula (19): 100% ($SrBi_4Ti_4O_{15}$); 80%; 50%; 33%; 20%; and 0% ($SrBi_2Nb_2O_9$). The voltages at which the hysteresis curves were run was 2, 4, and 6 volts as before. The Y-axis scale represents a range of from −25 to 25 $\mu C/cm^2$ for each hysteresis curve. Again, while both the strontium bismuth titanate and the strontium bismuth niobate are excellent ferroelectrics, solid solutions of the two near 50/50 ratios are not. Also a broad range of ferroelectric properties, such as values of 2Pr and 2Ec are represented near the two extremes of the solid solutions.

EXAMPLE 6

Strontium Bismuth Tantalum Niobium Titanate (TiTaNb)

Another series of wafers 10 including a number of capacitors 12, 24, 16, etc. was fabricated in which the layered superlattice material 30 was strontium bismuth niobium tantalum titanate, i.e.,

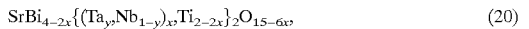

$$SrBi_{4-2x}\{(Ta_y Nb_{1-y})_x Ti_{2-2x}\}_2 O_{15-6x},\qquad(20)$$

wherein x and y range from 0 to 1. That is, a solid solution of Ti, Ta, and Nb, was fabricated. The precursor solution comprised strontium 2-ethylhexanoate, bismuth 2-ethylhexanoate, tantalum 2-ethylhexanoate, niobium 2-ethylhexanoate, and titanium 2-ethylhexanoate in a xylenes solvent. The five metal 2-ethylhexanoates were mixed in a proportion such that the strontium, bismuth, niobium and titanium were present in the mixed precursor in stoichiometric proportions, with x and y taking on a series of values from 0 to 1. Otherwise the fabrication process was the same as for Example 6 above. The final thickness of the film 30 was between 1850 Å and 24000 Å depending on the sample.

All three of the materials strontium bismuth tantalate (Ta), strontium bismuth niobate (Nb), and strontium bismuth titanate (Ti) may be mixed in solid solution in arbitrary ratio, making a single mixed ferroelectric phase, which can be represented Formula (20).

Polarization hysteresis measurements were conducted on respective samples having the following percentages of Ti/Ta/Nb, in terms of xy/x(1−y)/(2−2x): 100%/0%/0% ($SrBi_4Ti_4O_{15}$); 81%/10%/09%; 52%/25%/23%; 35%/34%/31%; 14%/45%/41%; and 0%/50%/50% ($SrBi_2TaNbO_9$). The voltages at which the hysteresis curves were run was 2, 4, and 6 volts as before. Again, while strontium bismuth titanate and strontium bismuth tantalum niobate are excellent ferroelectrics, solid solutions of the two near 50/50 ratios are not. Again, a broad range of ferroelectric properties, such as values of 2Pr and 2Ec are represented near the two extremes of the solid solutions.

Figure 15:
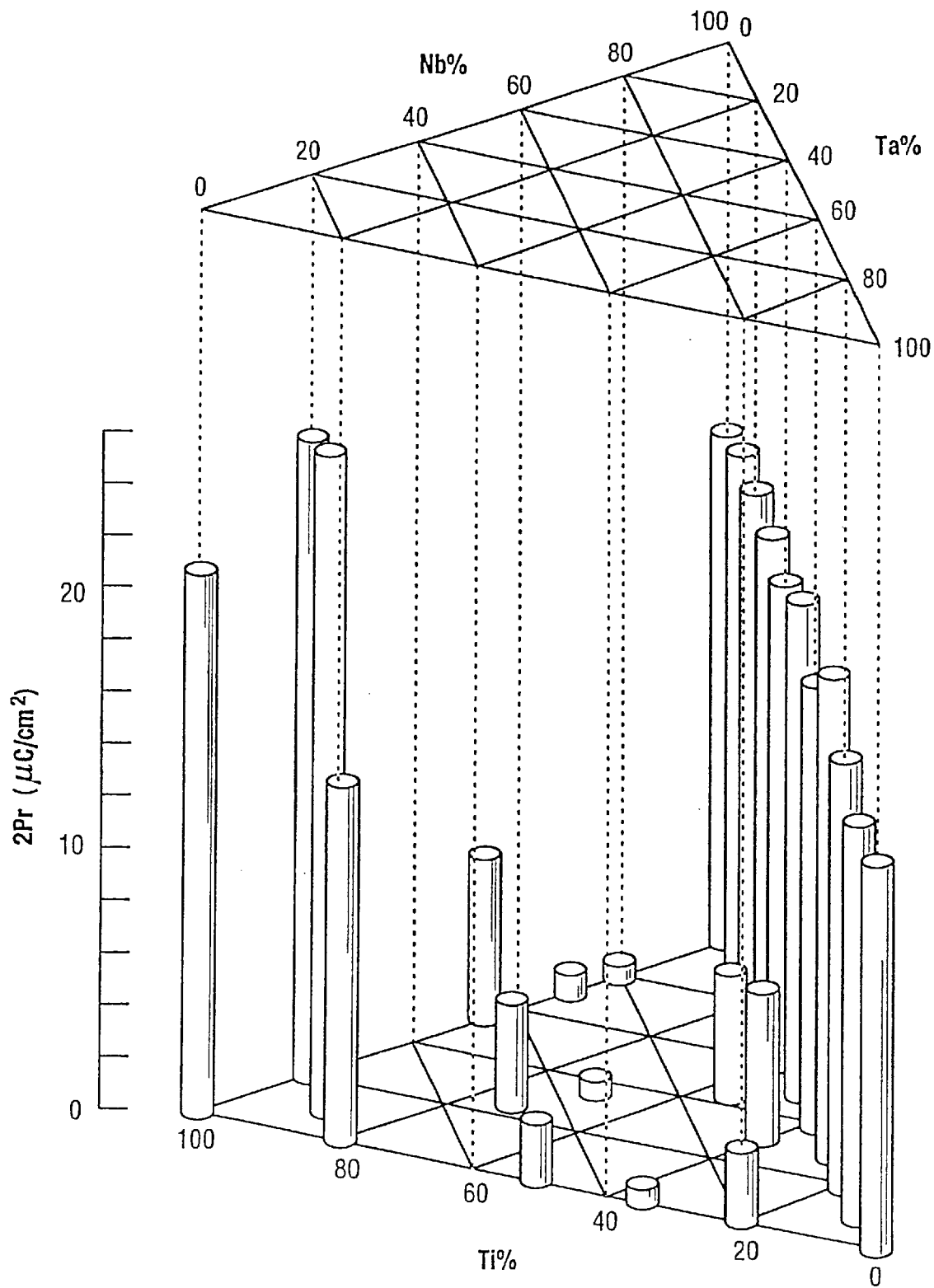
FIG. 15 shows a triangular diagram showing 2Pr for a variety of different solid solutions of strontium bismuth titanate, strontium bismuth tantalate, and strontium bismuth niobate.

FIG. 15 is a three dimensional diagram (represented in two-dimensions) showing 2Pr of most of the different layered superlattice materials and solid solutions fabricated according to Formula (20). Many patterns emerge from this diagram, including the one discussed in relation to FIG. 18, i.e. the rise of 2Pr from 100% Ta to 100% Nb, the generally lower value of 2Pr toward the center of the diagram, and others that were not evident from the isolated data, such as the rise in 2Pr along the 50% Ti line as it goes from 50% Ta to 50% Nb. Such patterns permit one to use records such as FIG. 15 to design ferroelectric devices having specific, predictable properties.

Figures 16, 17:
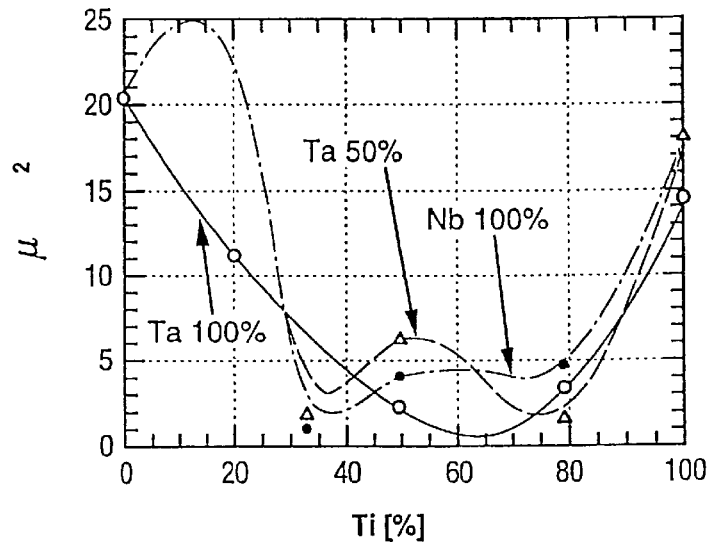
FIG. 16 shows graphs of 2Pr versus percentage of titanium for solid solutions of strontium bismuth titanate, strontium bismuth tantalate, and strontium bismuth niobate for differing relative amounts of tantalum and niobium.
FIG. 17 is a table listing 2Pr and 2Ec for various solid solutions of strontium bismuth titanate, strontium bismuth tantalate, and strontium bismuth niobate.

FIG. 16 is a graph showing the relation between 2Pr and the percentage of Ti in compositions of layered superlattice materials comprising solid solutions of Ti, Ta, and Nb having specific percentages of Ta and Nb. Such curves depict slices through the three dimensional diagram of FIG. 25 parallel to the Ti axis. Such "slices" make it easier to recognize patterns that provide design direction and advantages.

FIG. 17 is a table in which some of the data discussed above, including the sample thickness, is arranged in groups from which patterns emerge. This table illustrates another way of arranging data in records to assist in the design of electronic devices.

Figure 18:
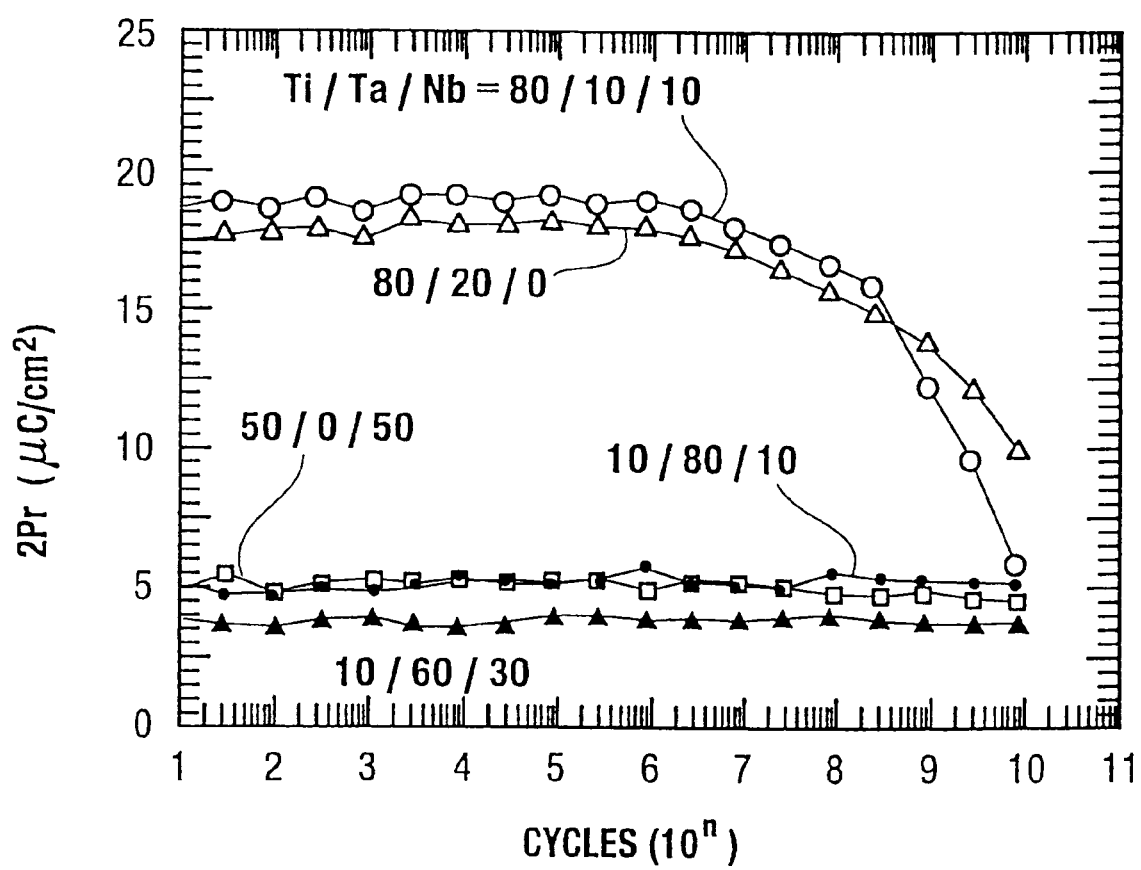
FIG. 18 shows graphs of 2Pr versus number of cycles for some of the samples of FIGS. 13 through 15.

FIG. 18 is a graph showing polarization fatigue curves for various TiTaNb layered superlattice compositions discussed above. The data shows that compositions with high Ti content ($0.0 \leq x \leq 0.2$), have a large 2Pr but poor resistance to fatigue beyond $10^9$ cycles. On the other hand, compositions with about equal Ti and Nb content, show a comparably excellent resistant to fatigue to the TaNb compounds. This curve thus illustrates still another method of recording data that can cause patterns useful in design of electronic devices to surface.

There exist numerous other layered superlattice materials, and numerous other elements besides tantalum, niobium, and titanium can also be included in the layered superlattice solid solutions discussed above, as well as numerous other solid solutions. These possibilities are too numerous to discuss fully here. However, to illustrate this, a solid solution including zirconium will be discussed in the next example.

EXAMPLE 7

Strontium Bismuth Titanium Zirconate (ZrTi)

Another series of wafers 10 including a number of capacitors 12, 24, 16, etc. was fabricated in which the layered superlattice material 30 was strontium bismuth titanium zirconate, i.e.,

$$SrBi_4(Ti_z,Zr_{1-z})_4O_{15} \quad (21)$$

wherein z ranges from 0 to 1. That is, a solid solution of Zr and Ti, was fabricated. The precursor solution comprised strontium 2-ethylhexanoate, bismuth 2-ethylhexanoate, titanium 2-ethylhexanoate and zirconium 2-ethylhexanoate in a xylenes solvent. The four metal 2-ethylhexanoates were mixed in a proportion such that the strontium, bismuth, niobium and titanium were present in the mixed precursor in stoichiometric proportions, with z taking on a series of values from 0 to 1. The molarity of the solution was diluted to approximately 0.07 moles per liter by the addition of n-butyl acetate as a second solvent. The RTP bake step 89 (FIG. 1) was performed with a holding temperature of 750° C. Otherwise the fabrication process was the same as for Example 6 above. The final thickness of the film 30 was between 3000 Å and 3500 Å depending on the sample.

Zirconium is in the same transition metal column of the periodic table of the elements as titanium and can be easily substituted for titanium in a layered superlattice crystal structure in an arbitrary amount.

Figure 19:
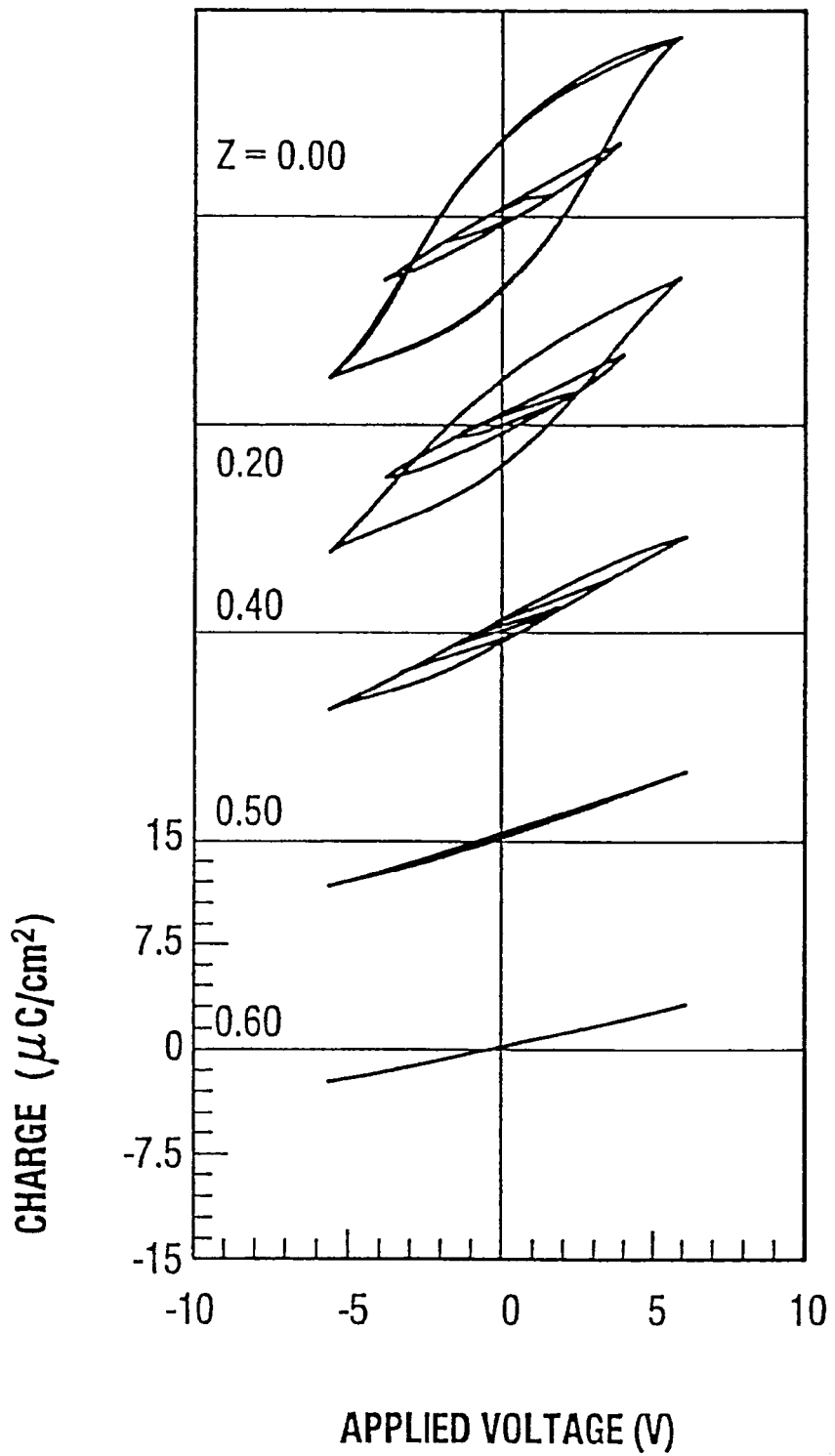
FIG. 19 shows hysteresis curves at 2, 4, and 6 volts for samples with different solid solutions of strontium bismuth titanate and strontium bismuth zirconate.
Figure 20:
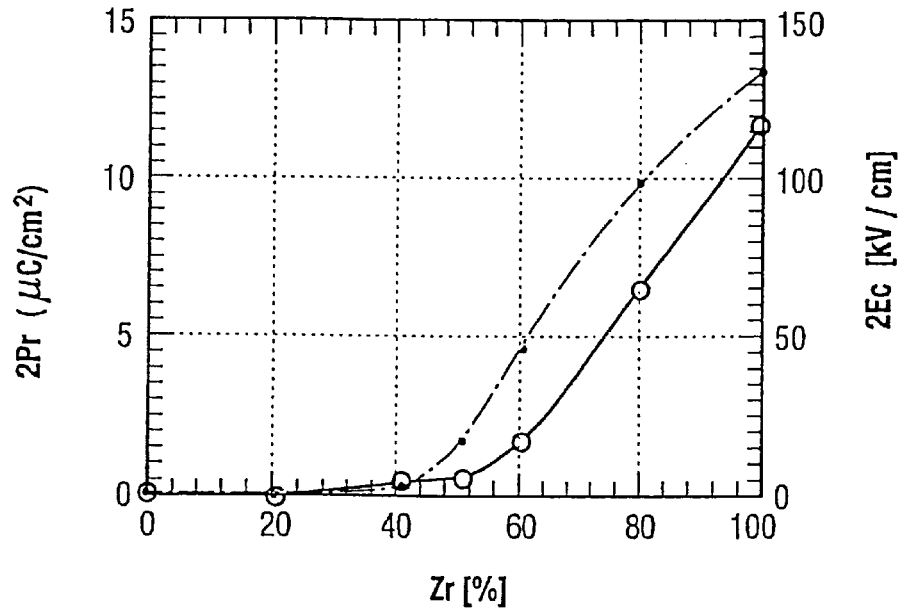
FIG. 20 shows graphs of 2Pr and 2Ec versus zirconium percentage for the samples of FIG. 19.
Figure 21:
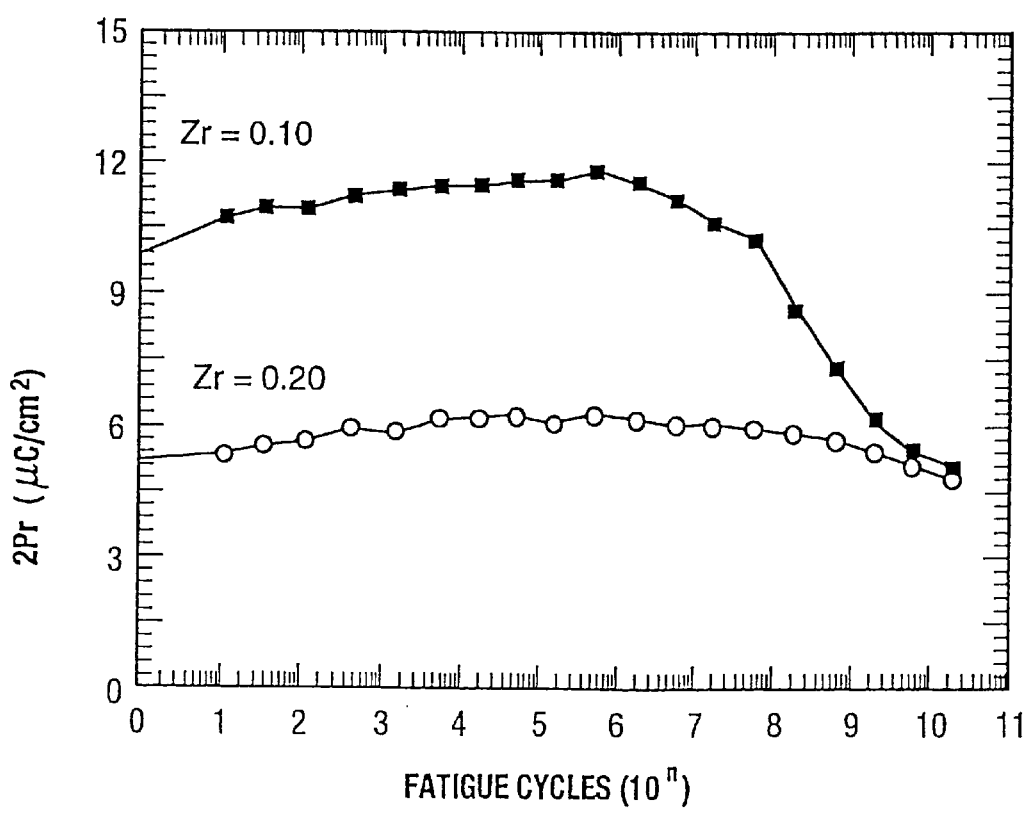
FIG. 21 shows graphs of 2Pr versus number of cycles for two different samples of solid solutions of strontium bismuth titanate and strontium bismuth zirconate having different percentages of zirconium.

FIG. 19 depicts polarization hysteresis curves for six different samples of ZrTi having the following percentages of Zr: 0% ($SrBi_4Ti_4O_{15}$); 20%; 40%; 50%; and 60%. The voltages at which the hysteresis curves were run was 2, 4, and 6 volts as before. The y-axis scale reperesents a range from −15 to 15 $\mu C/cm^2$ for each hysteresis curve. In this case, the ferroelectric properties disappear if more than 50% zirconium is added. This does not mean that the material with more than 50% Zr is not a layered superlattice material;

it may merely mean that the ferroelectric transition temperature changes so that the material is no longer ferroelectric at room temperature, and/or that the material becomes a layered superlattice dielectric material. FIG. 20 is a graph of 2Pr and 2Ec as a function of Zr percentage, while FIG. 21 shows the fatigue curves for the material with 10% Zr and the material with 20% Zr. The figures show that while 2Pr and 2Ec decrease close to linearly with the addition of Zr, the resistance to fatigue improves with the addition of Zr, at least up to 20%. Thus, Zr also offers opportunities for device design.

The ZrTi compound can be combined with any of the layered superlattice materials and solid solutions thereof that were discussed above in arbitrary ratios. The electronic properties of such solid solutions form a continuum with the electronic properties discussed above. Thus each metal that forms layered superlattice materials literally adds a new dimension to a diagram such as shown in FIG. 15. Other metals that form layered superlattice materials and thus add such new dimensions include, of course, strontium and bismuth which have been in all the compounds discussed herein, and also calcium, barium, cadmium, lead, hafnium, tungsten, scandium, yttrium, lanthanum, antimony, chromium, and thallium.

6. Optimizing Superlattice Electrical Performance Through Stoichiometric Proportioning Techniques It has been discovered that some of these materials produce crystalline structures having enhanced stable properties as dielectric or ferroelectric materials. This benefit can be realized by taking proper care to combine elements of the formula within optimal stoichiometric ratios or molar proportions in the precursor solution. The resultant stoichiometrically proportioned final crystals, as well as the methods of making them, constitute especially preferred embodiments of the present invention. Those skilled in the art will understand that a great variety of different superlattice materials may be constructed from precursor solutions according to the above-described examples, with crystalline properties being enhanced through the stoichiometric relative proportioning of lattice elements, or the addition of small amounts of metallic oxide dopants.

The precursors may be mixed to include a dopant fraction having a metallic alkoxocarboxylate, alkoxide, or carboxylate, such as tantalum 2-ethylhexanoate, to introduce or alter a proportional metallic moiety distribution in the final superlattice materials. For example, a precursor having sufficient metallic oxygenated organic complexes to provide a final dielectric crystalline material of the formulation $SrBi_2Ta_2O_9$ can be doped to provide a 10% $Ta_2O_5$ ("TaO") concentration by mixing sufficient tantalum 2-ethylhexanoate to provide an excess of 10 mol % Ta, or $Ta_{2.2}$, in the final formula ($SrBi_{2.0}Ta_{2.2}O_{9.5}$).

EXAMPLE 8

Strontium Content Optimization Study

The precursor solution from Example 1 was selected as a primary precursor solution for use in further investigations comparing the effects of different strontium concentrations upon ferroelectric and dielectric properties. The primary precursor solution selected for further investigation was one having metallic 2-ethylhexanoates in relative proportions sufficient to produce a final material having the average formula of $Sr_1Bi_2Ta_2O_9$. The sensitivity analysis was conducted to determine the effect of strontium content upon the ferroelectric properties of field intensity and polarizability for the superlattice materials that derive from these precursors. In this sensitivity study, the strontium of the precursor solution was varied according to the sensitivity formula

$$Sr_w Bi_{2.0} Ta_2 O_{8+w}, \qquad (22)$$

wherein the quantity (8+w) represents an oxygen portion derived from excess oxygen in the precursor and annealing environments, and provides an oxygen anion charge in an amount sufficient to balance the corresponding charge from the portion of $Sr^{+2}$ cation that varies as w.

In addition to the primary precursor liquid, a series of secondary precursor liquids were produced having various strontium concentrations according to the sensitivity formula. These respective precursor liquids were produced according to the methods described in previous examples, by mixing respective metallic carboxylate fractions in proportions corresponding to the proportions of metallic elements in the formula. In this manner, several secondary precursor liquids were produced having strontium molar portions of 0.0, 0.15, 0.25, 0.35, 0.5, 0.6, 0.8, 0.9, 1.0, 1.1, 1.2, and 1.4.

A similar set of solutions was produced according to a second sensitivity formula

$$Sr_w Bi_{2.2} Ta_2 O_{8.3+w}, \qquad (23)$$

with the strontium content being varied to produce precursor liquids having strontium molar proportions of 0.5, 0.6, 0.7, 0.8, 0.9, 1.0, 1.1, and 1.2. This excess amount of bismuth was added to components from the volatilization of bismuth oxide at the annealing temperatures.

Each these precursors was used to manufacture, under identical conditions, a thin-film wafer having numerous capacitors according to the method of Example 1. Ferroelectric properties, namely, polarization (as 2Pr) and electric field (as Ec) were measured according to conventional techniques. For example, 2Pr was determined from hysteresis measurements (charge versus applied voltage) that were conducted according to standard protocols on a circuit including a Hewlet Packard 3314A function generator and a Hewlet Packard 54502A digitizing oscilloscope.

Figure 22:
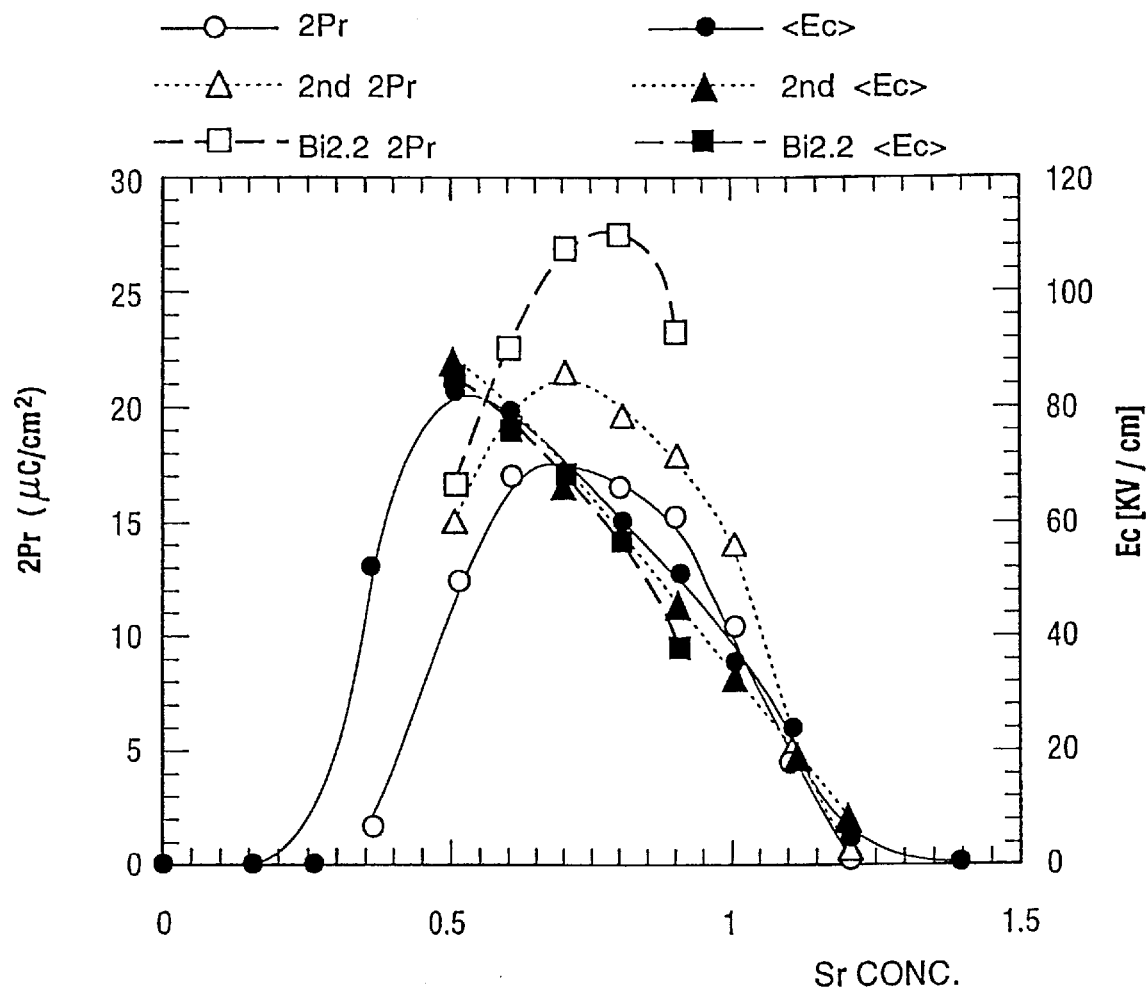
FIG. 22 depicts 2Pr versus Ec for hysteresis measurements from numerous capacitors manufactured according to different dielectric material formulations having various Sr concentrations in stoichiometric proportion with other formula elements.

FIG. 22 depicts the results of ferroelectric property measurements as a plot of polarization and field intensity values for measurements conducted on the various samples. As indicated by the legend on FIG. 22, the respective lines corresponding to the open and filled circles represent measurements taken on virgin samples of the Formula (22) class of formula variants. The respective lines corresponding to the open and filled triangles represent second measurements taken on the same samples under identical conditions. The respective lines corresponding to the open and filled squares represent measurements conducted on the virgin Formula (23) variants. These results indicate that 2Pr approaches 0 in the samples having a Sr concentration exceeding 100% of the 1.0 molar portion.

Figure 23:
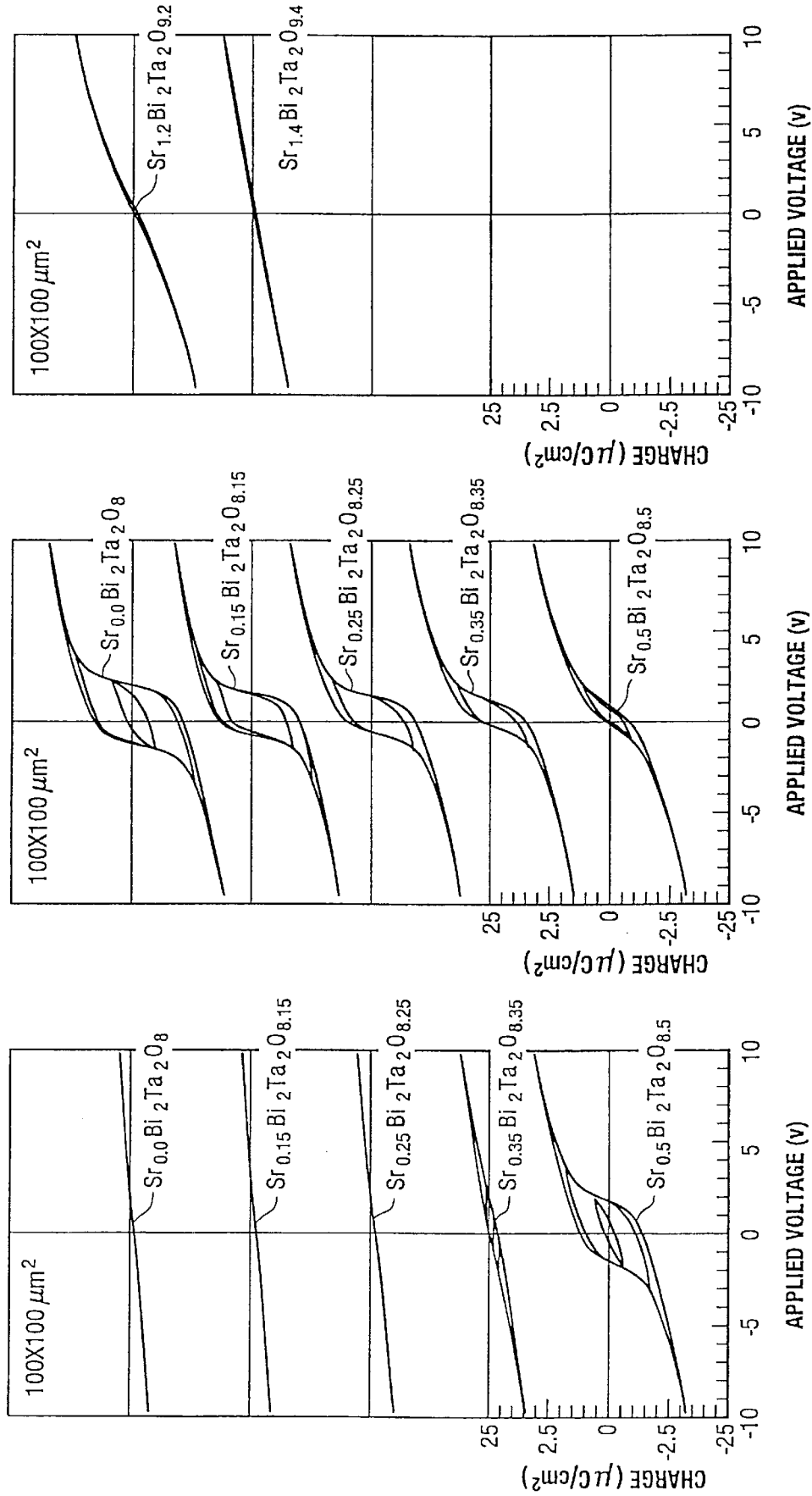
FIG. 23 depicts hysteresis curves for capacitors used to construct the FIG. 2 plot having a dielectric material including a $Sr_wBi_2Ta_2O_{8+w}$ formulation, with these curves representing initial polarization measurements at the respective voltages.

FIG. 23 depicts the individual first-run hysteresis curves for each of the dielectric materials according to Formula (22). The respective curves represent materials having their formulations varied as indicated to investigate the hysteresis sensitivity of strontium concentration. These measurements were used to construct the circle curves of FIG. 22.

Figure 24:
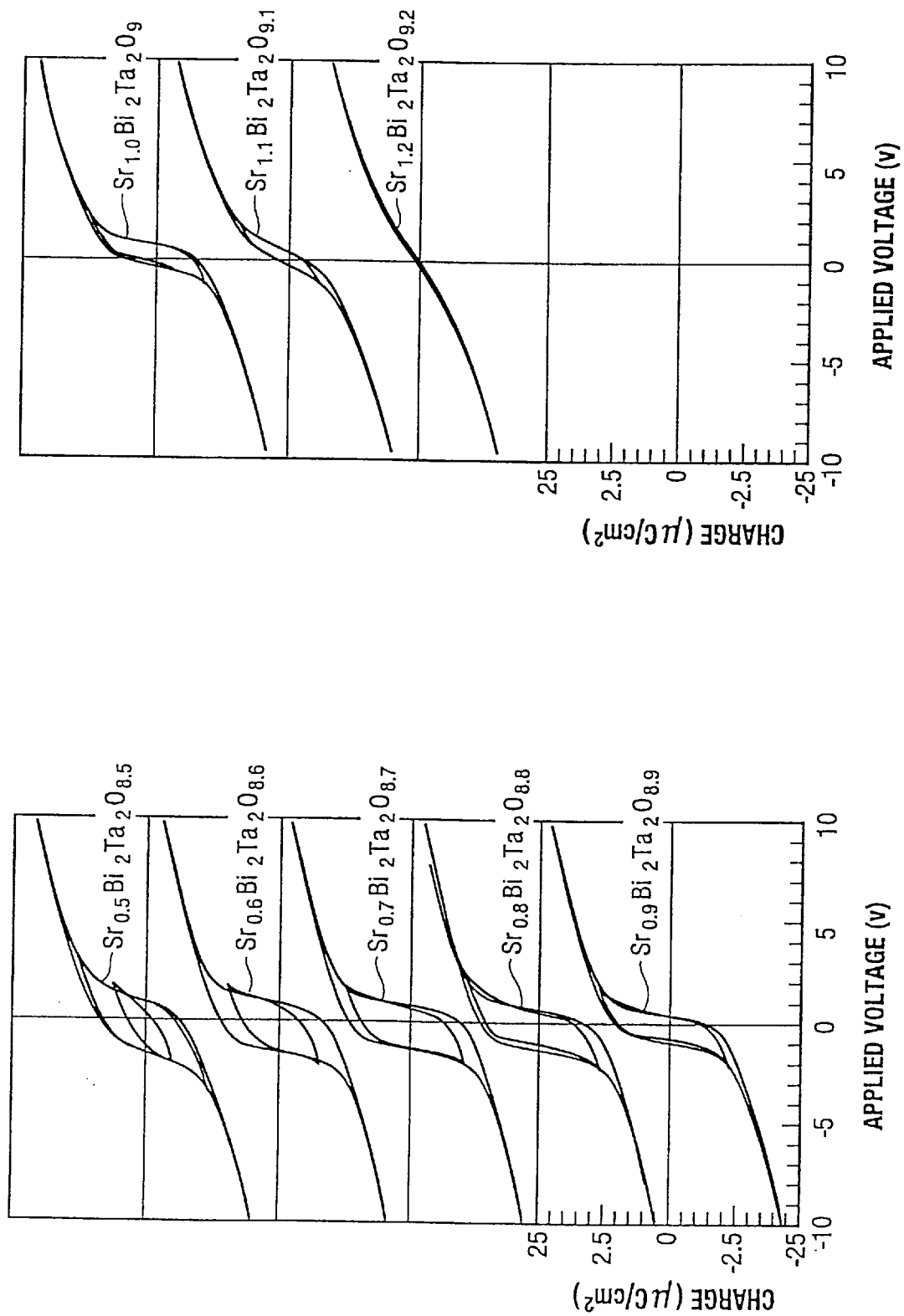
FIG. 24 depicts hysteresis curves for capacitors used to construct the FIG. 22 plot, with these curves representing second measurements conducted on the FIG. 23 samples at the respective voltages.

FIG. 24 depicts the individual second-run hysteresis curves for each of the dielectric materials according to Formula (22). The respective curves represent materials having their formulations varied to investigate the sensitivity of strontium concentration as it affects the hysteresis curve. These measurements were used to construct the triangle curves of FIG. 22.

Figure 25:
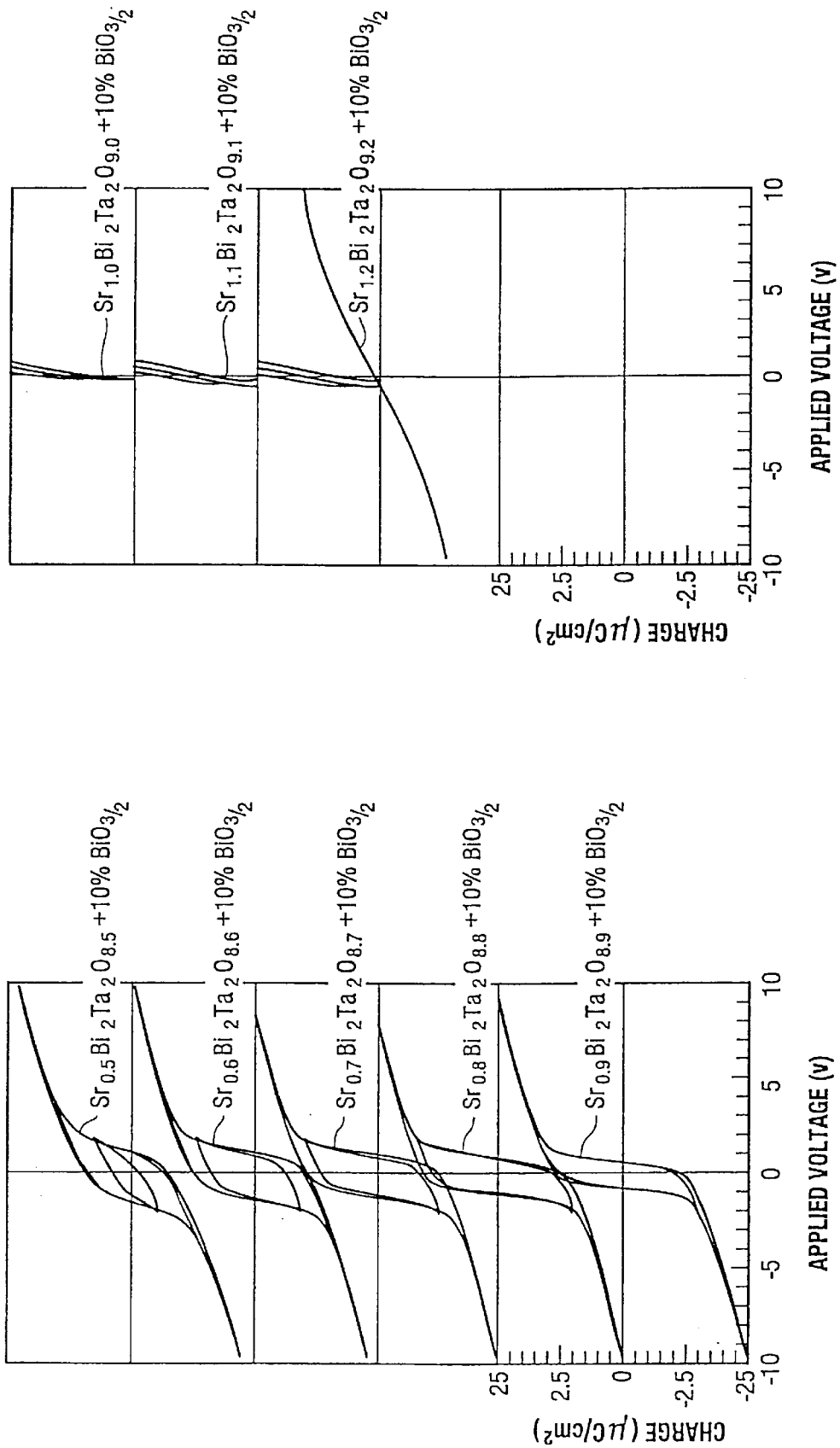
FIG. 25 depicts hysteresis curves for capacitors used to construct the FIG. 37 plot having a dielectric material including a $Sr_wBi_{2.2}Ta_2O_{8.3+w}$ (ten mol % excess Bi) formulation.

FIG. 25 depicts the individual hysteresis curves for each of the dielectric materials according to Formula (23) (10% excess bismuth). The materials have their formulations varied to investigate the sensitivity of strontium concentration as it affects the hysteresis curve. These measurements were used to construct the square curves of FIG. 22.

The results of FIGS. 22 through 25 demonstrate that crystals having poor stability, as indicated by a lack of measurement repeatability and incidence of capacitor shorting, are produced when the Sr concentration falls below a 0.35 portion or above a 1.1 portion. In the case of materials formed from precursors having 10% excess bismuth, shorting occurred for strontium portions above 1.0. For the formulations studied, materials having a Sr concentration falling outside the $Sr_{0.35}$ to $Sr_{1.1}$ range are typically characterized by poor dielectric performance and poor ferroelectric performance. In contrast, capacitors having dielectric layers including strontium in a molar portion from about 0.35 to about 1.1 are polarizable, exhibit good dielectric characteristics, and have a relatively stable crystalline structure under bias voltage stresses.

Figure 26:
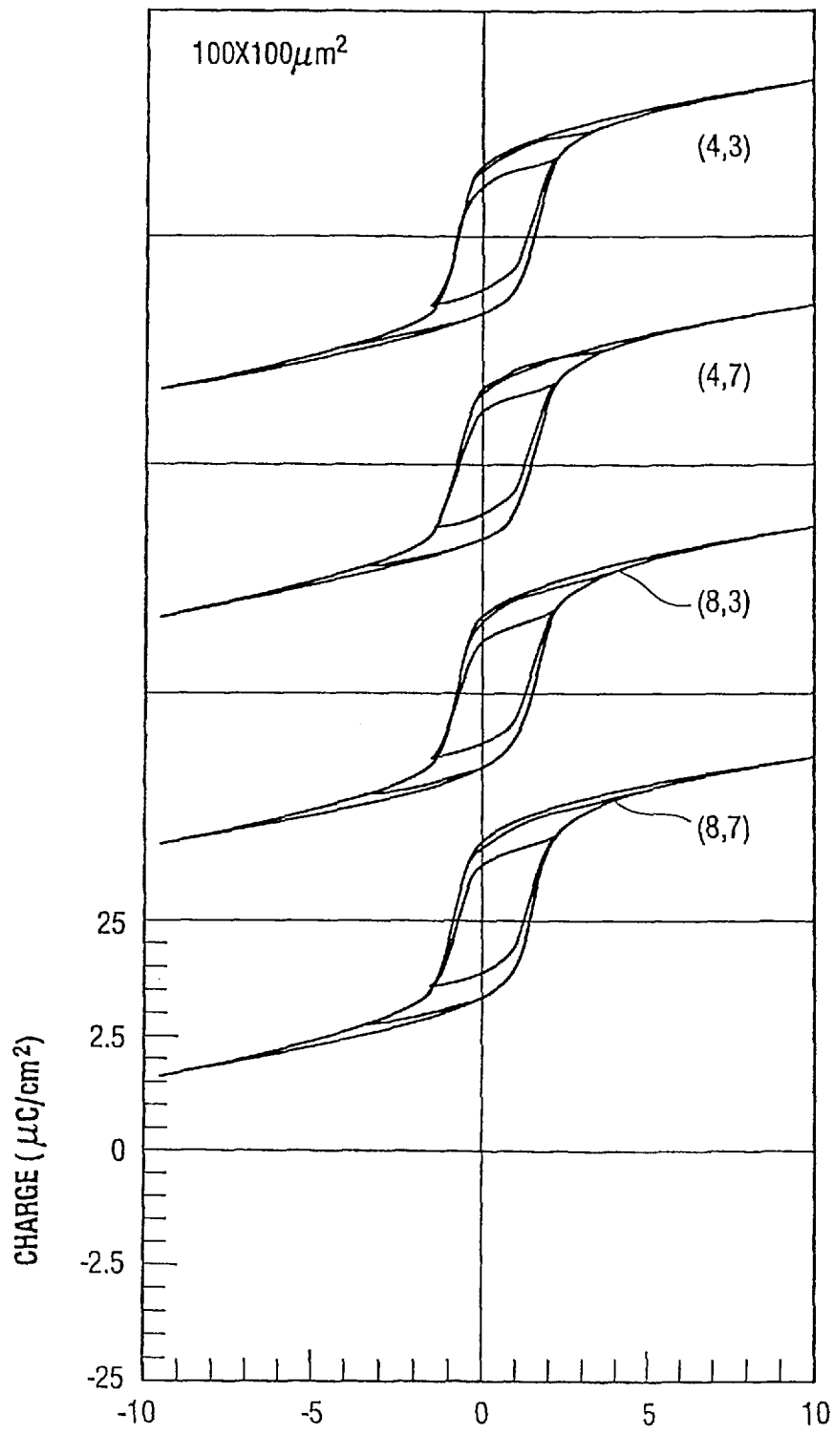
FIG. 26 depicts a plurality of hysteresis curves taken from different surface portions of a single capacitor or wafer having the formulation $Sr_{0.8}Bi_2Ta_2O_{8.8}$.
Figure 27:
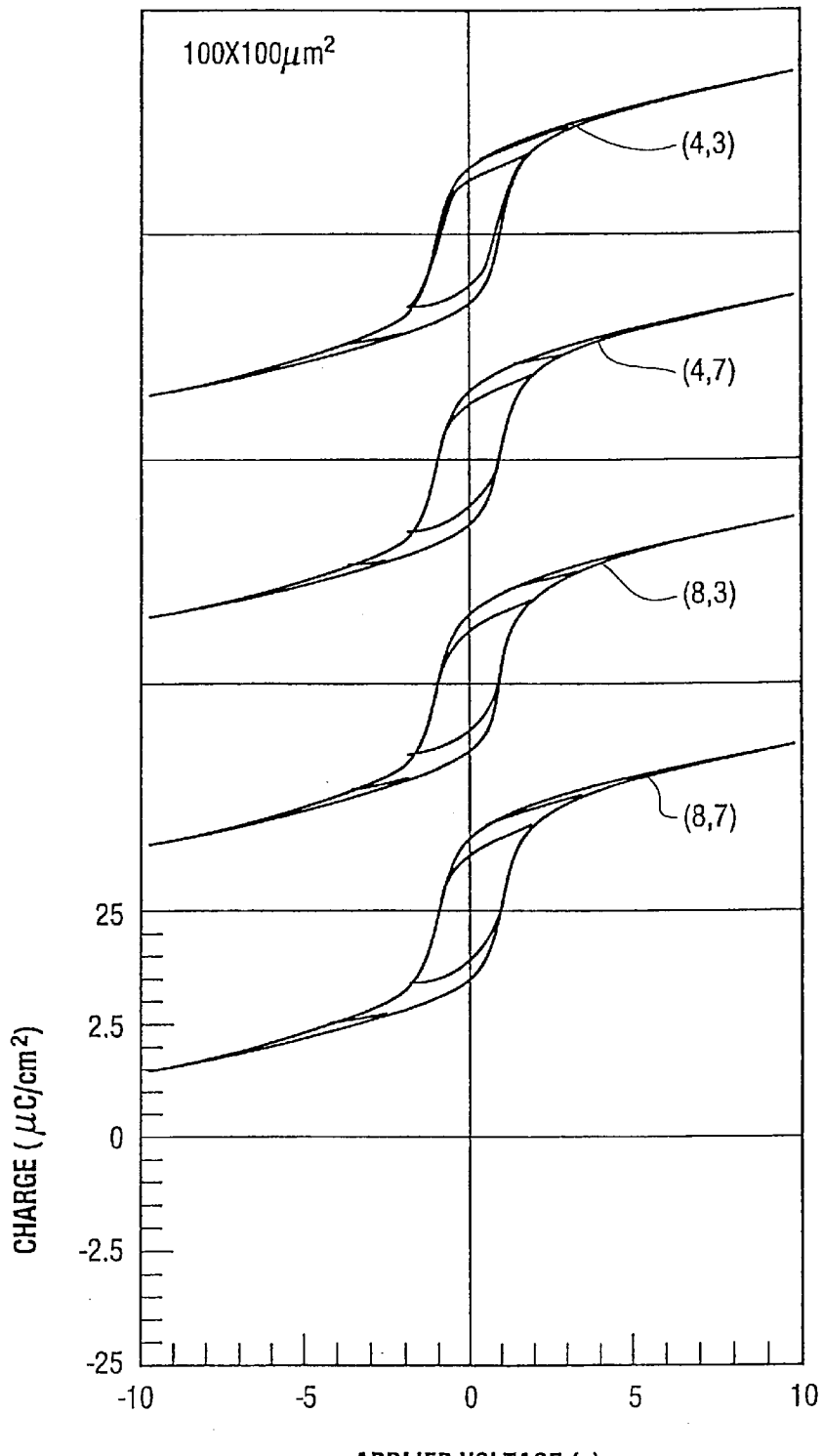
FIG. 27 depicts hysteresis curves similar to those of FIG. 26, but representing measurements taken from a dielectric material having a formulation $Sr_{0.9}Bi_2Ta_2O_{8.9}$.
Figure 28:
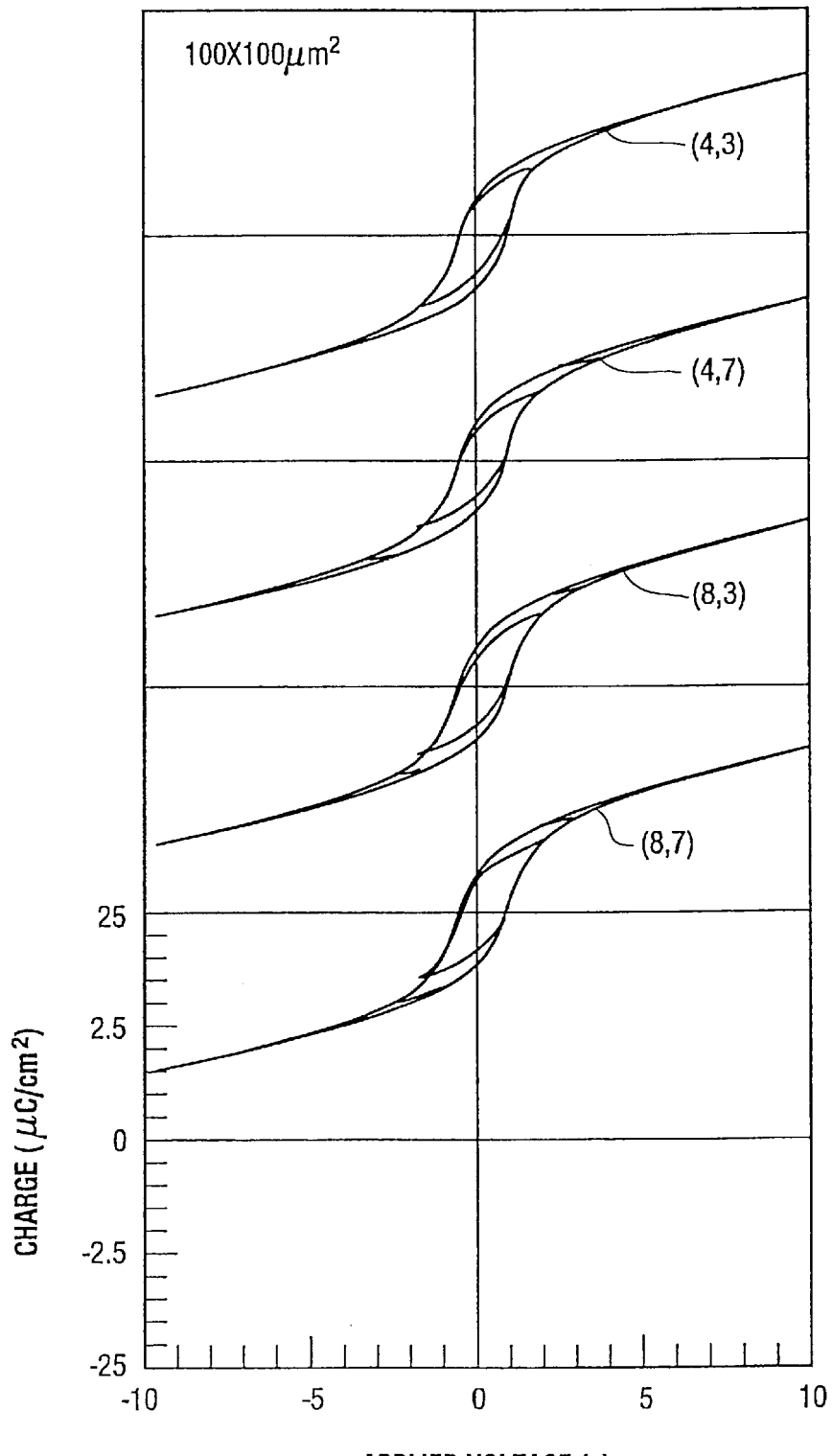
FIG. 28 depicts hysteresis curves similar to those of FIG. 26, but representing measurements taken from a dielectric material having a formulation $Sr_1Bi_2Ta_2O_9$.
Figure 29:
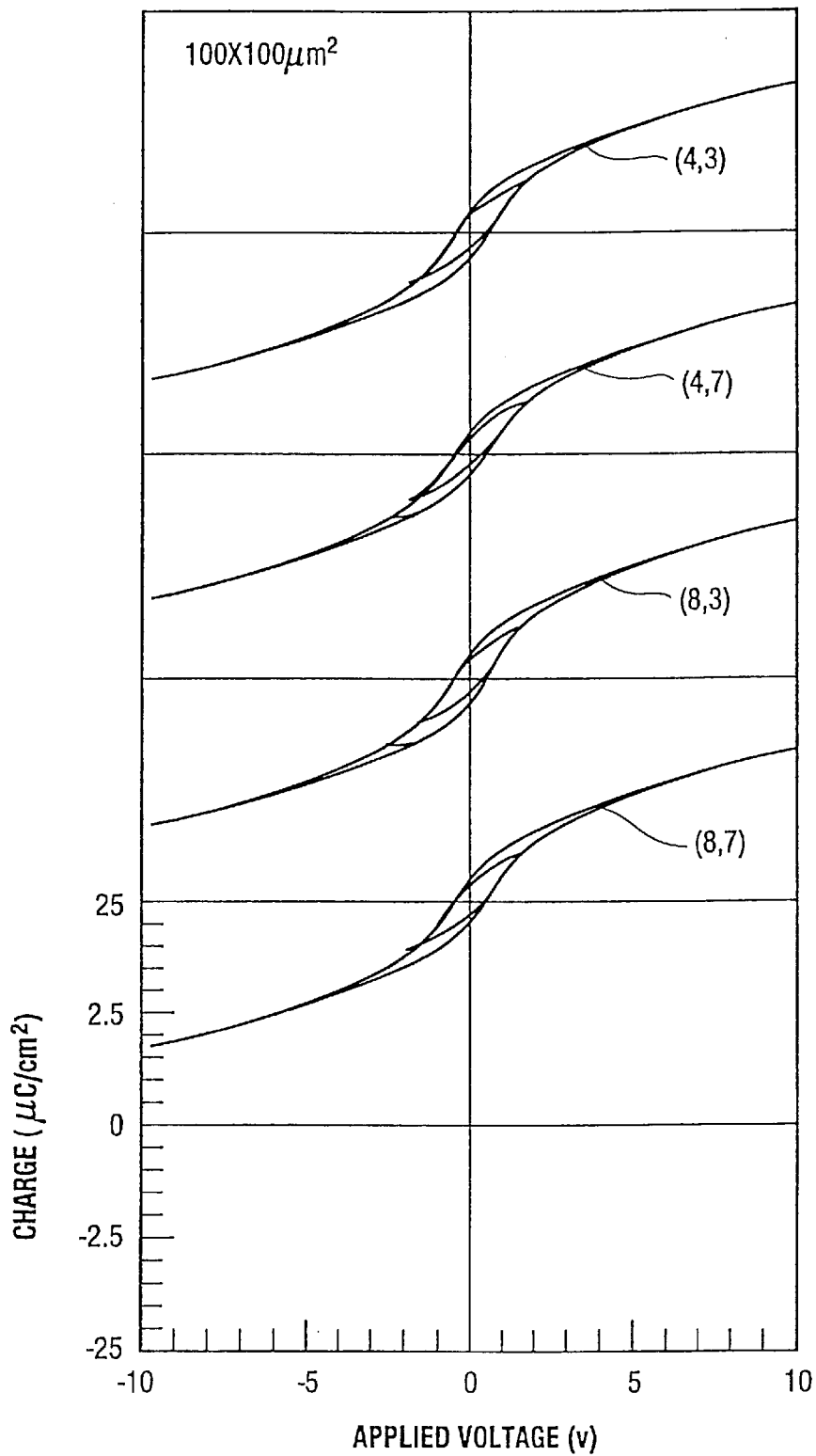
FIG. 29 depicts hysteresis curves similar to those of FIG. 26, but representing measurements taken from a dielectric material having a formulation $Sr_{1.1}Bi_2Ta_2O_{9.1}$.
Figure 30:
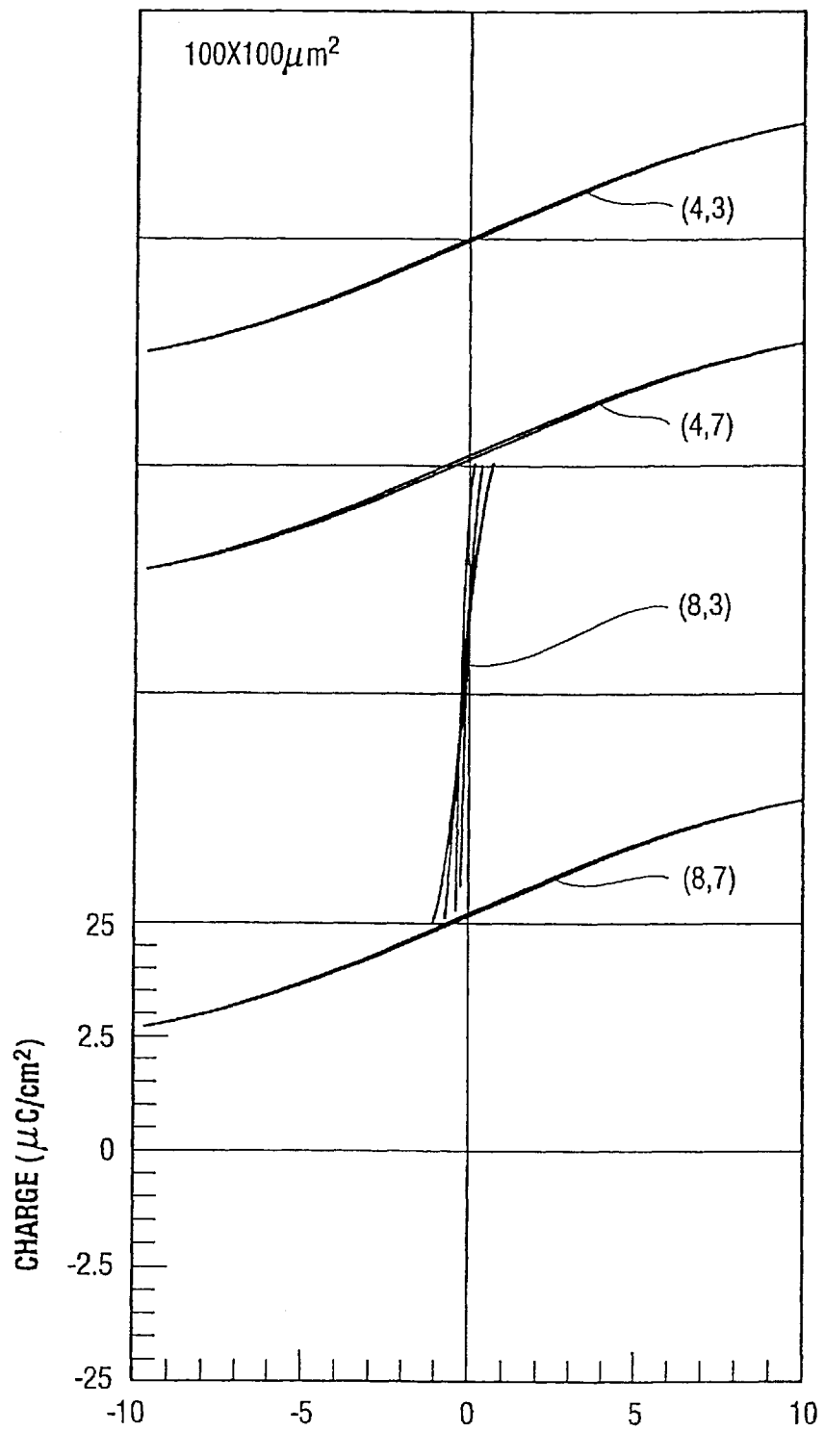
FIG. 30 depicts hysteresis curves similar to those of FIG. 26, but representing measurements taken from a dielectric material having a formulation $Sr_{1.2}Bi_2Ta_2O_{9.2}$, wherein the Sr-rich formation has caused a short in the capacitor circuit.
Figure 31:
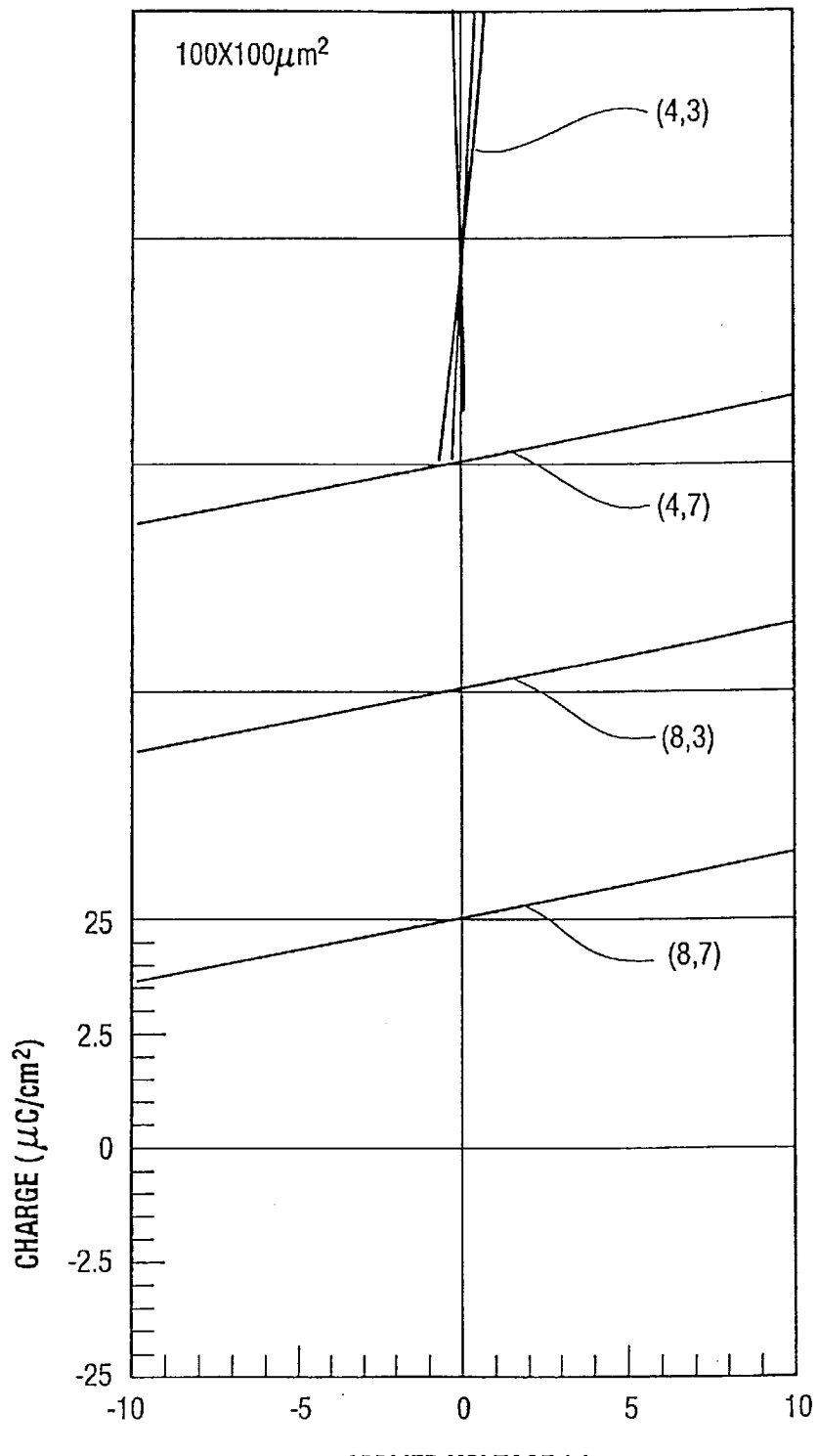
FIG. 31 depicts hysteresis curves similar to those of FIG. 26, but representing measurements taken from a dielectric material having a formulation $Sr_{1.4}Bi_2Ta_2O_{9.4}$, wherein the Sr-rich formation has caused a short in the capacitor circuit.

FIGS. 26–31 each depict a plurality of hysteresis curves taken from different strontium bismuth tantalate capacitor sites formed on a single wafer. The parenthetical numbers, e.g., (8,3), serve to identify a capacitor site on the wafer grid. Each figure corresponds to a different wafer, with the strontium content changing for the different wafers as indicated on the figures, e.g., FIG. 26 depicts measurements taken from four capacitors on a wafer having the formulation $Sr_{0.8} Bi_{2.0} Ta_{2.0} O_{8.8}$. The precursors used to form these materials had no excess bismuth added. Among all of these figures, the strontium portion was varied between 0.8 and 1.4. At each concentration, the respective curves are substantially identical, and exhibit good ferroelectric properties, until, at a strontium portion of about 1.1, the material begins to demonstrate poor ferroelectric properties. The ferroelectric phenomenon completely fails for materials having strontium portions of 1.2 and greater.

Figure 32:
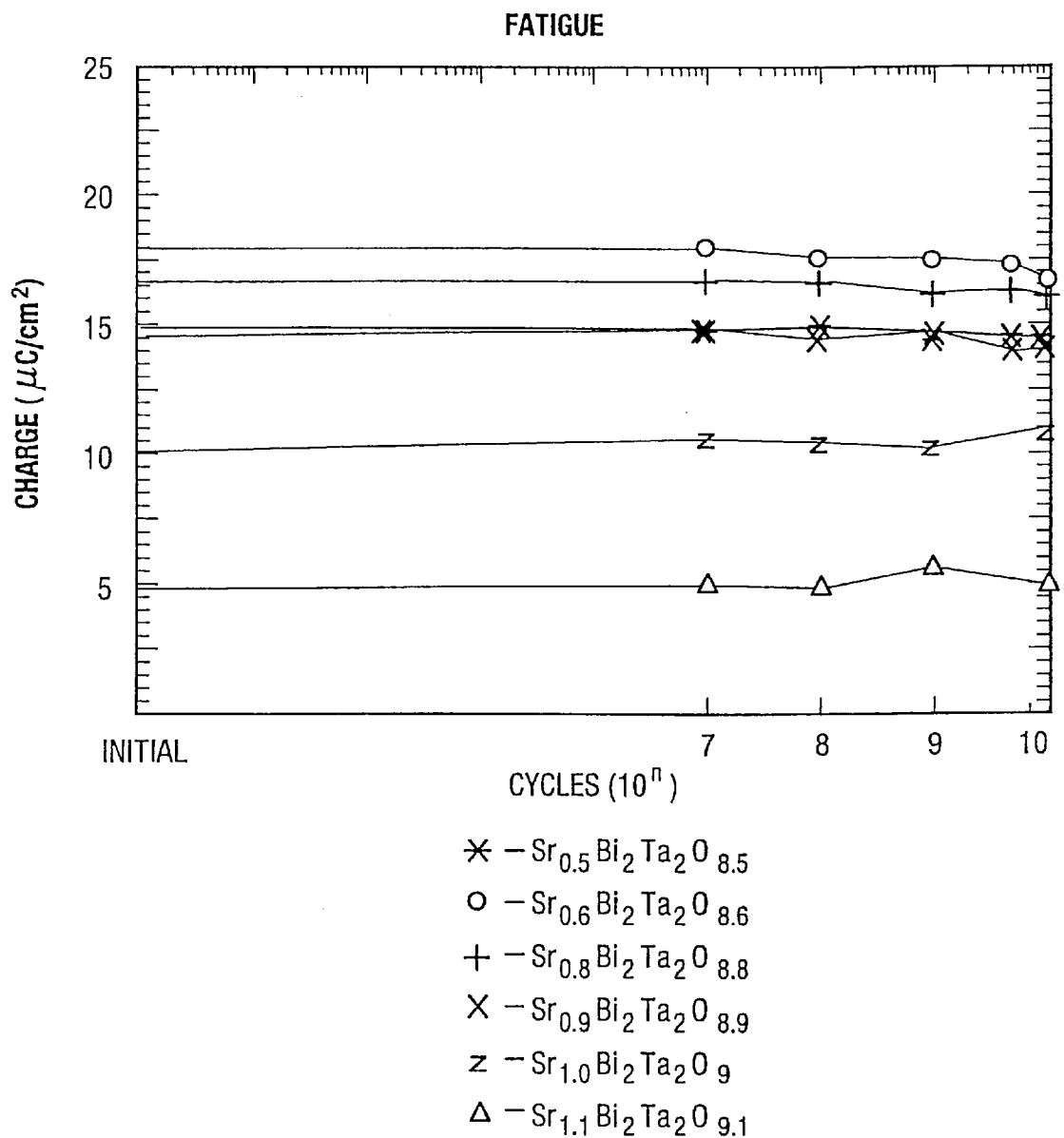
FIG. 32 depicts results for fatigue measurements conducted on dielectric material samples having strontium molar portions ranging from 0.5 to 1.1.

FIG. 32 depicts results for polarization fatigue measurements conducted on ferroelectric materials after switching them up to $10^{10}$ cycles. These measurements were conducted by repeatedly charging and discharging the samples on a 5.7V sine wave, and measuring the retained charge under identical conditions each time. The six samples had Sr molar portions ranging from about 0.5 to about 1.1 according to formula (22), and were formed from precursor solutions having no excess bismuth. These materials exhibited extremely low or negligible levels of fatigue.

EXAMPLE 9

Figure 33:
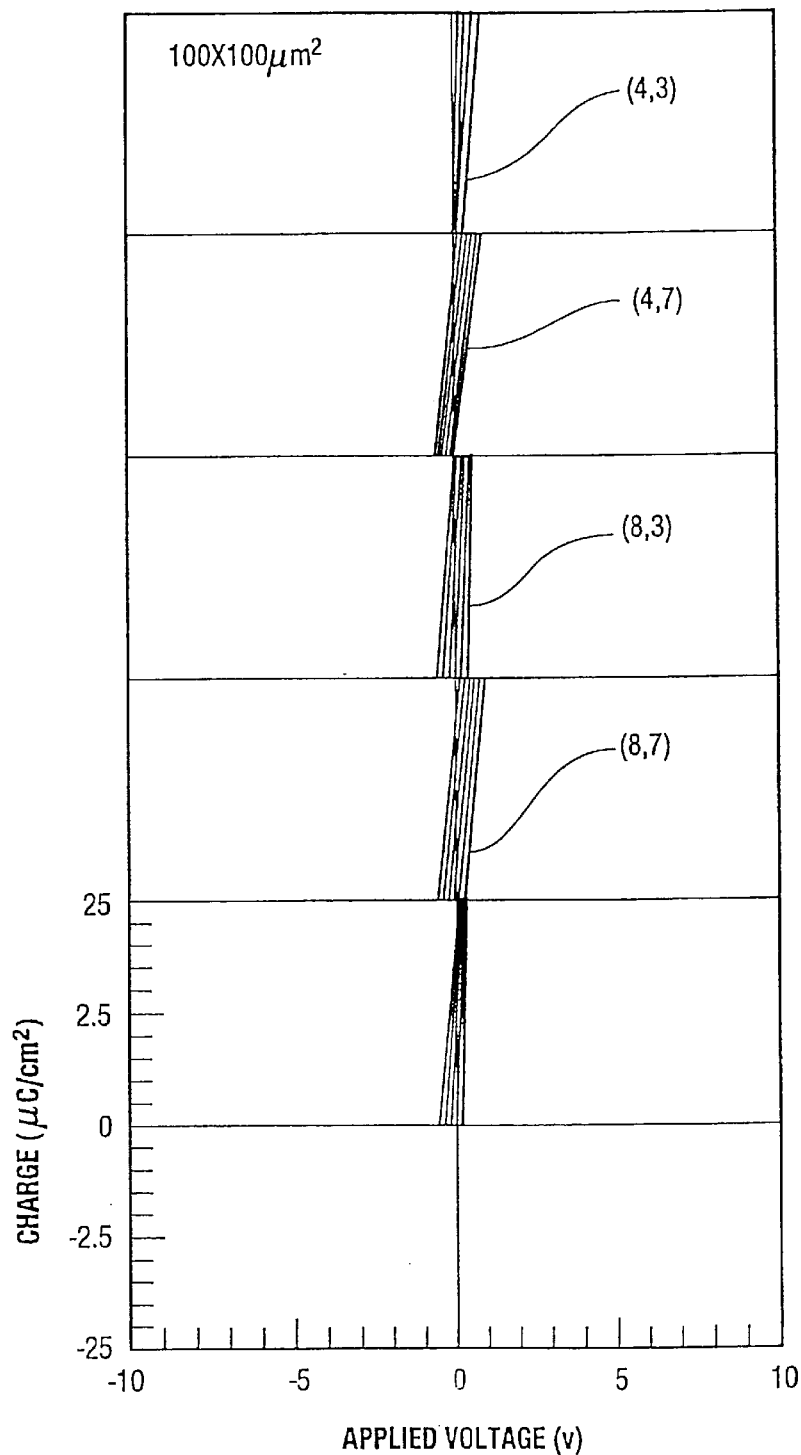
FIG. 33 depicts several hysteresis curves taken from a capacitor having a dielectric curve of the formulation $SrBi_{2.2}Ta_2O_{9.3}$, wherein the capacitor exhibits shorting or a near total failure of the dielectric layer.

Preventing Shorts in Strontium Bismuth Tantalate Materials through the Addition of A-Site and B-Site Dopants FIG. 33 depicts hysteresis curves taken from different capacitors manufactured on a wafer incorporating a dielectric or ferroelectric layer having the formulation $SrBi_2 Ta_2 O_9$ with an additional 10% excess bismuth added to the precursor solution. The metal layers of these capacitors are shorted and, therefore, useless as ferroelectric capacitors.

Figure 34:
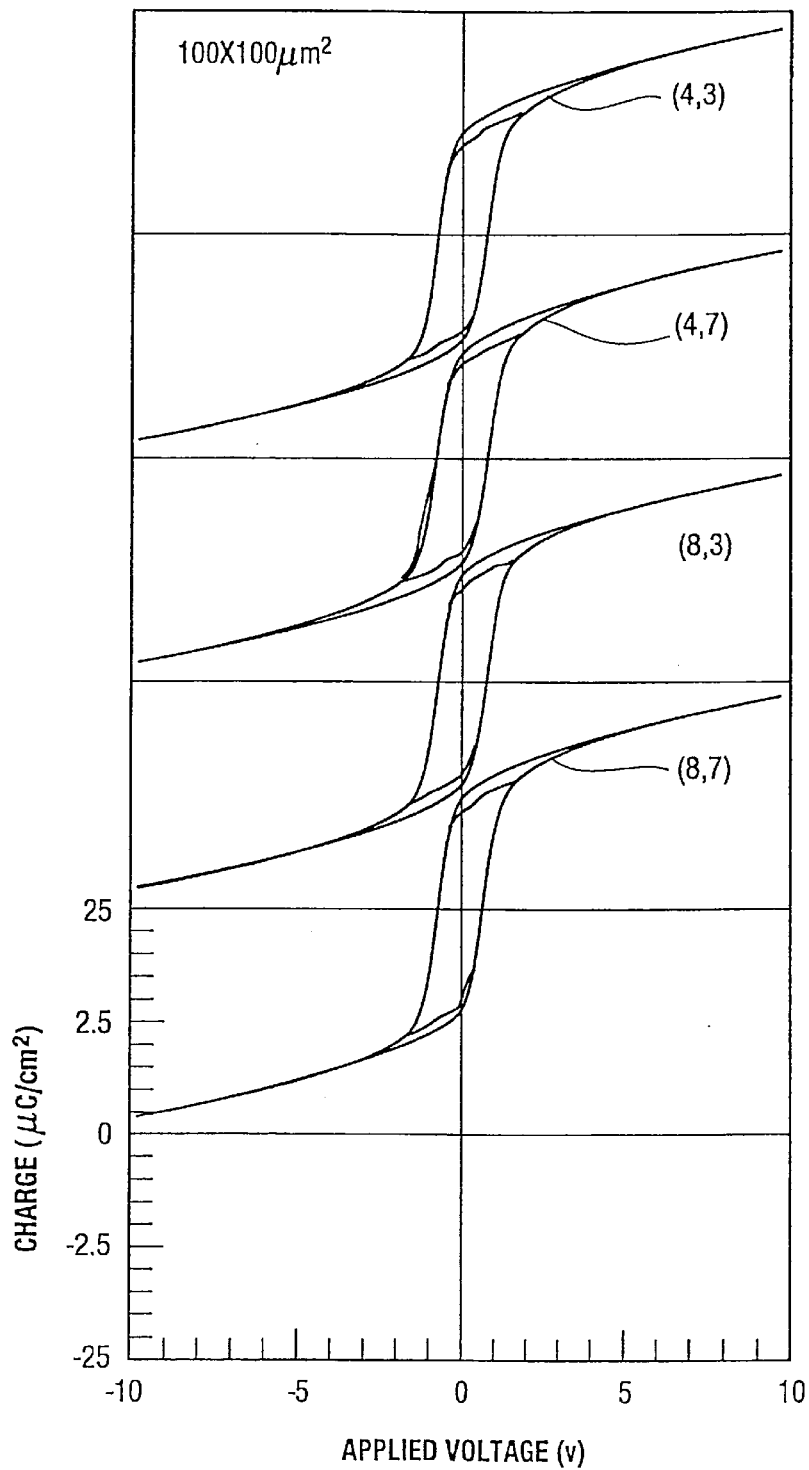
FIG. 34 depicts several hysteresis curves taken from a capacitor having a dielectric material formulation $SrBi_{2.2}Ta_2O_{9.3}$, like the formulation of FIG. 33, but with a ten mole percent dopant of $Bi_2Ta_2O_8$ added, wherein the dielectric layer has not failed.

In contrast, FIG. 34 depicts first run hysteresis results for capacitors including a ferroelectric material made from a precursor having the same formulation as that which produced the FIG. 33 material, but adding a dopant of 10 mol % $Bi_2 Ta_2 O_8$ to the resultant crystalline material. These dopants are prepared by adding to the stock precursor solution a combination of bismuth 2-ethylhexanoate and tantalum 2-ethylhexanoate. The FIG. 34 capacitors are not shorted, and exhibit good ferroelectric properties in terms of boxy, rectangular curves.

Figure 35:
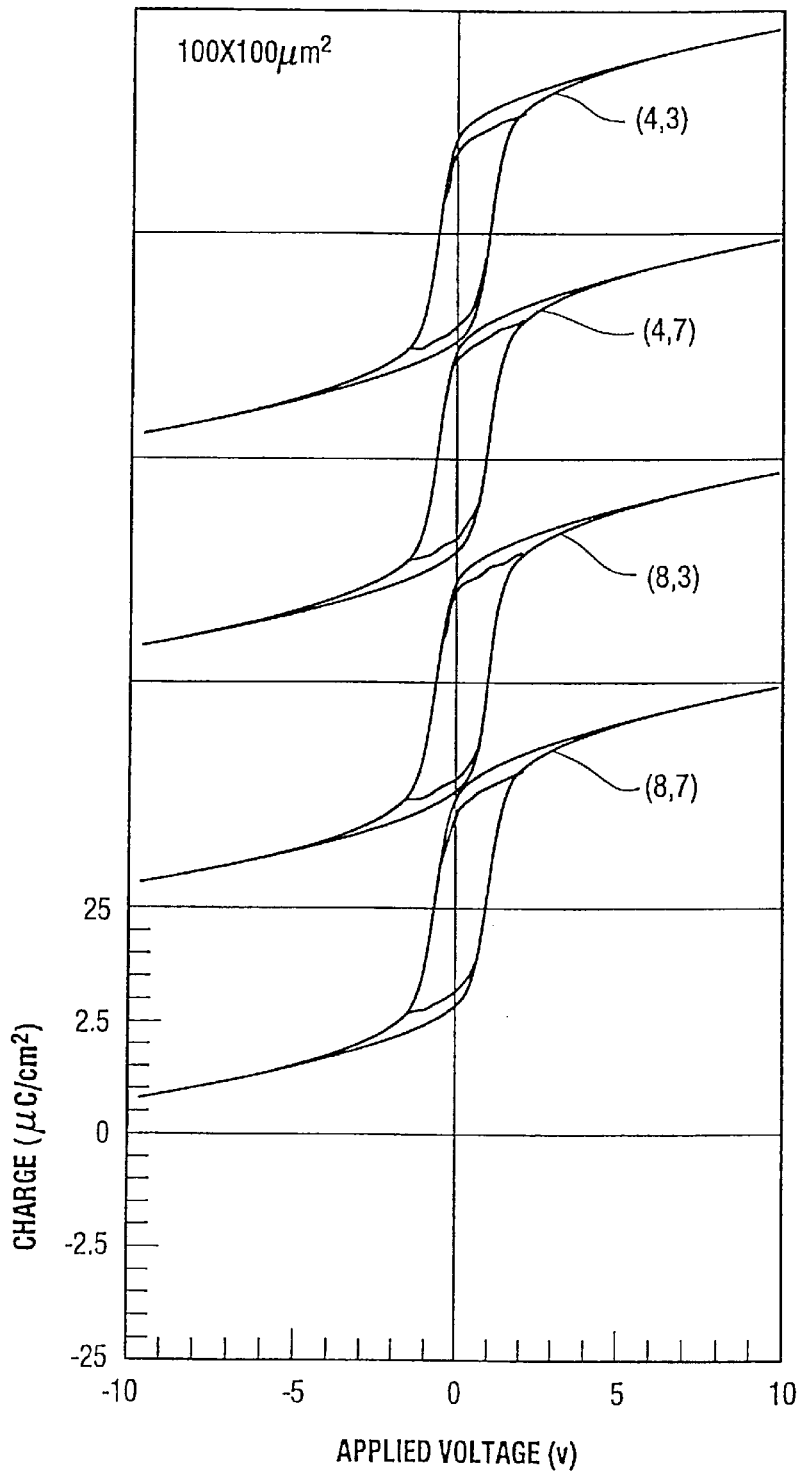
FIG. 35 depicts a hysteresis curve for a dielectric material having a formulation including $SrBi_2Ta_2O_9$ but with 10 mole percent $Bi_2Ta_2O_8$ added as a dopant, wherein the dielectric layer has not failed.

FIG. 35 depicts second run hysteresis results for the capacitors of FIG. 34. The FIG. 35 measurements demonstrated good repeatability between successive runs.

Figure 36:
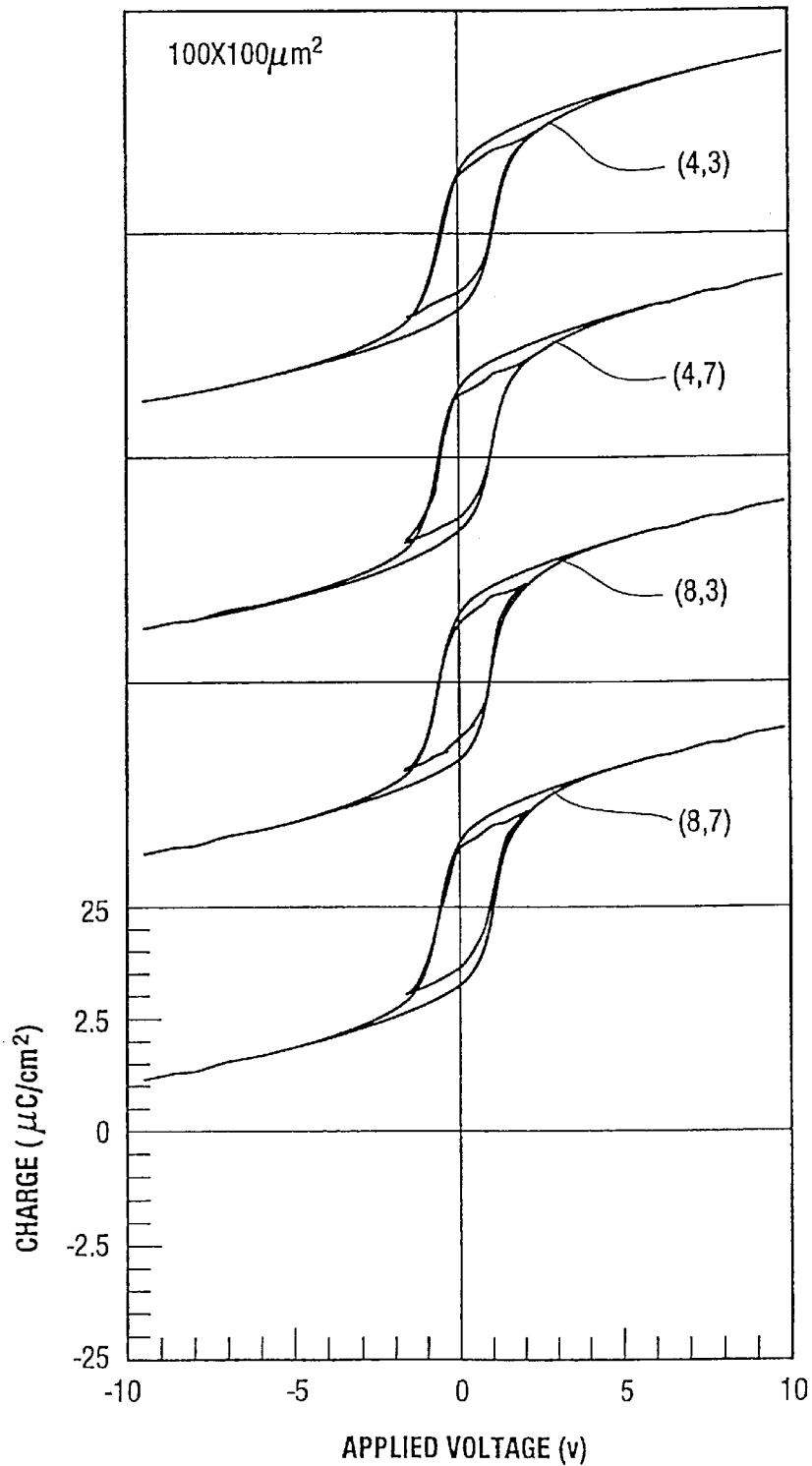
FIG. 36 depicts a hysteresis curve for a dielectric material having a formulation including $SrBi_2Ta_2O_9$ but with 20 mole percent TaO added as a dopant, wherein the dielectric layer has not failed.

FIG. 36 depicts hysteresis results for capacitors having ferroelectric materials of the $SrBi_2Ta_2O_9$ plus 10% excess bismuth formulation, with an additional 20 mol % $TaO_{5/2}$ dopant added. Again, the $TaO_{5/2}$ dopant alleviated the shorting problem that was observed in FIG. 33.

Figure 37:
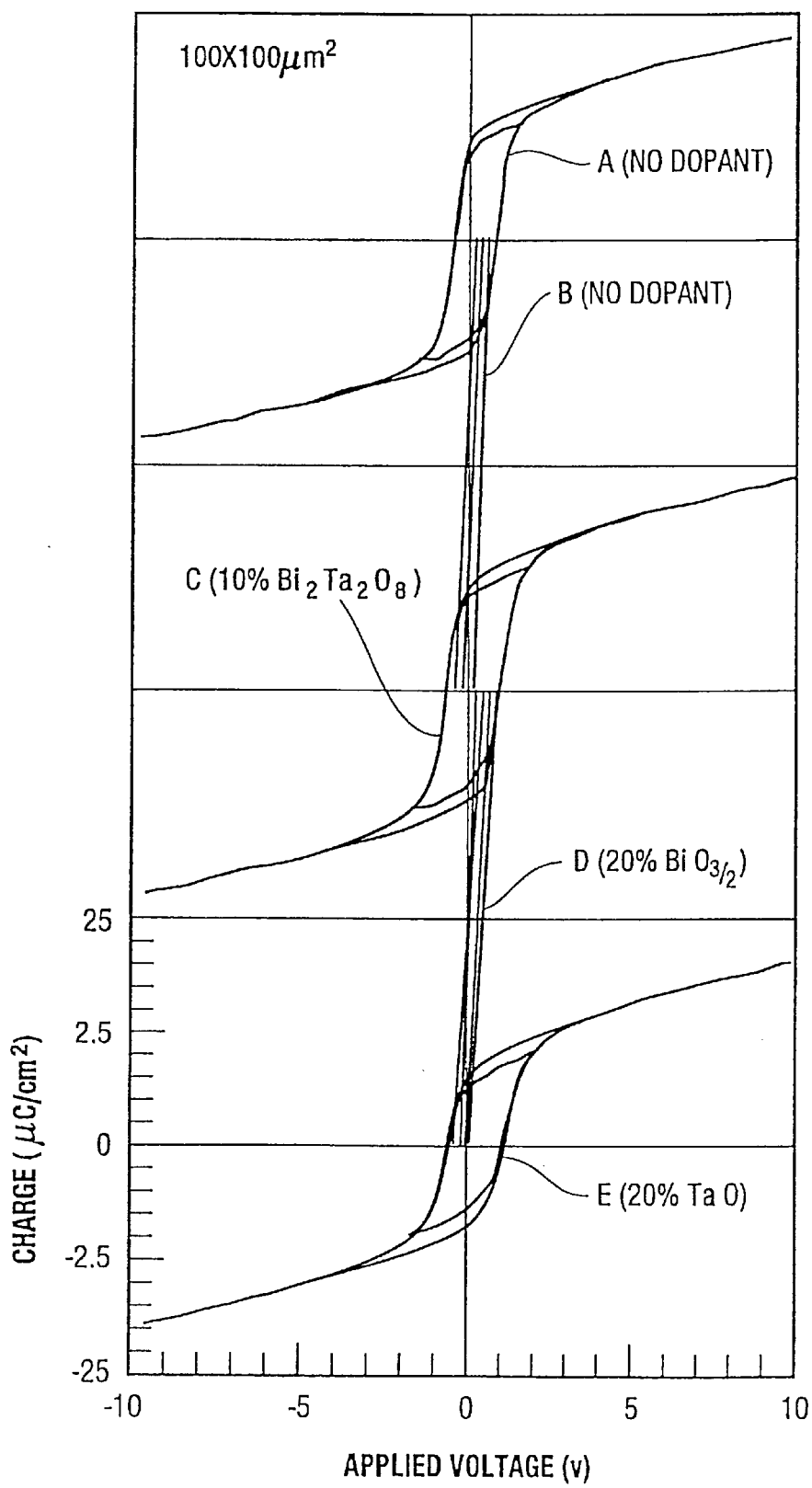
FIG. 37 depicts hysteresis curves for capacitors having respective dielectric materials including the base formulation $SrBi_{2.2}Ta_2O_{9.3}$ with various dopants added, including BiO, TaO, and $Bi_2Ta_2O_8$.

FIG. 37 depicts several hysteresis curves for metal oxide materials that were produced from a based stock of precursor solution corresponding to a $SrBi_2Ta_2O_9$ formula to which 10% excess $BiO_{3/2}$ was added in addition to a dopant. The respective curves are labeled with the dopant concentrations, namely, no dopant, 10% $Bi_2Ta_2O_8$, 20% $BiO_{3/2}$, and 20% $TaO_{5/2}$. Again, the 10% $Bi_2Ta_2O_8$ and 20% $TaO_{5/2}$ dopants (Curves C and E) remedied the shorting problem that was observed in FIG. 33. The 20% $BiO_{3/2}$ dopant failed to remedy the shorting problem. Curve A actually produced a viable ferroelectric material in the absence of a dopant.

In this manner, the observance of certain stoichiometric proportions within the superlattice formulation will result in ferroelectric and dielectric materials having especially stable crystalline structures. In particular, these formulations have the formula:

$$Sr_w[Bi_{4-2x+\alpha}\{(Ta_y,Nb_{1-y})_x,(Ti_z,Zr_{1-z})_{2-2x}\}_2O_{15-6x}]_c, \quad (24)$$

wherein the formula elements are as described above $0 \leq w \leq 1$, and $c \geq 1$. In this formula, the especially stable crystals will result when quantity $c \div w$ is $\geq 1$. This ratio may be maintained following a number of especially preferred modes. A first mode exists wherein $w \leq 1$, and $c=1$. A second mode exists where $w=1$ and $c \geq 1$. A third mode exists where $0.6 \leq w \leq 1.0$ and $c \geq 1$.

By way of example, with reference to the formula immediately above $$Sr_w[Bi_{4-2x+\alpha}\{(Ta_y,Nb_{1-y})_x,(Ti_z,Zr_{1-z})_{2-2x}\}_2O_{15-6x}]_c, \quad (25)$$

as compared to $Sr_{1.0}Bi_{2.0}Ta_{2.0}O_{9.0}$ of this example, w is 1.0, x is 1.0, $\alpha$ is zero, c is 1, and the quantity ($w \div c$) is 1.0.

In another formula $$Sr_w(Bi_\alpha Ta_2)_y O_z, \quad (26)$$

as compared to $Sr_{1.0}Bi_{2.0}Ta_{2.0}O_{9.0}$ of this example, w is 1.0, $\alpha$ is 2.0, y is 1.0, z is 9.0, and the quantity ($w \div y$) is 1.0.

In yet another formula $$(SrBi_\alpha)_x Ta_y O_z, \quad (27)$$

as compared to $Sr_{1.0}Bi_{2.0}Ta_{2.0}O_{9.0}$ of this example, $\alpha$ is 2.0, x is 1, Y is 2, and z is 9.0.

There have been described optimized processes and compositions for making electronic devices utilizing layered superlattice materials, the dependence of the electronic properties on the processes and compositions has been demonstrated, and methods for utilizing the data on electronic properties as a function of layered superlattice processes and compositions to make electronic devices has been described. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that prebaking of the substrate, RTP bake, and bismuth content have been identified as critical for layered superlattice material optimization, these processes can be combined with conventional processes to provide variations on the processes described. It is also evident that the steps recited may in some instances be performed in a different order. Or equivalent structures and process may be substituted for the various structures and processes described. Or a variety of different dimensions and materials may be used. Further, now that the impact of the regularity of the properties of layered superlattice materials and the variety of the materials on electronic design and manufacturing has been pointed out, many design and manufacturing processes utilizing the concepts disclosed may be devised. Consequently, the invention is to be construed as embracing each and every novel feature and novel combination of features present in and/or possessed by the fabrication processes, electronic devices, and electronic device manufacturing methods described.

We claim:

1. A ferroelectric device comprising:

a pair of electrodes;

a layered superlattice material compound interposed between said electrodes and having an average empirical formula $$Sr_w[Bi_{4-2x+\alpha}\{(Ta_y,Nb_{1-y})_x,(Ti_z,Zr_{1-z})_{2-2x}\}_2O_{15-6x}]_c,$$

wherein w, c, x, y, z, and $\alpha$ represent numbers corresponding to molar portions of formula substituents, $0 \leq x \leq 1.0$, $0 \leq y \leq 1.0$, $0 \leq z \leq 1.0$, $(x-2) \leq \alpha \leq 1.6(2-x)$, $0 \leq w \leq 1.0$, $c \leq 1.0$, and $(c \div w) \geq 1$.

2. A ferroelectric device as in claim 1, wherein $w \leq 1$.

3. A ferroelectric device as in claim 1, wherein $0.6 \leq w \leq 1.0$.

4. A ferroelectric device as in claim 1, wherein the layered superlattice material compound includes strontium bismuth tantalate and a dopant selected from the group consisting of calcium, barium, cadmium, lead, hafnium, tungsten, scandium, yttrium, lanthanum, antimony, chromium, and thallium.

5. A ferroelectric device as in claim 4, wherein said dopant includes a B-site metal selected from the group consisting of hafnium and tungsten.

6. A ferroelectric device comprising:

a pair of electrodes;

a layered superlattice material compound interposed between said electrodes and having an average empirical formula $$Sr_w(Bi_\alpha Ta_2)_y O_z,$$

wherein w, $\alpha$, y, and z represent numbers corresponding to molar portions of formula substituents, $0 \leq w \leq 1.0$, $0 \leq y \leq 1.0$, $2 \leq \alpha \leq 2.2$, $0.6 < (w \div y) < 1.0$, and z is sufficient to balance a charge of said formula by providing sufficient oxygen anion to balance a positive charge from the Sr, Bi, and Ta cations.

7. A ferroelectric device as in claim 6, wherein said layered superlattice material compound includes strontium bismuth tantalate and a dopant selected from the group consisting of calcium, barium, cadmium, lead, titanium, hafnium, tungsten, niobium, zirconium, scandium, yttrium, lanthanum, antimony, chromium, and thallium.

8. A ferroelectric device as in claim 7, wherein said dopant includes a B-site metal selected from the group consisting of hafnium and tungsten.

9. A ferroelectric device comprising:
   a pair of electrodes;
   a layered superlattice material compound interposed between said electrodes and having an average empirical formula

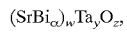
   $(SrBi_\alpha)_w Ta_y O_z,$ wherein w, y, $\alpha$ and z represent numbers corresponding to molar portions of formula substituents, $0 \leq w \leq 1.0$, $0 \leq y \leq 1.0$, $2 \leq \alpha \leq 2.2$, $2 < y/w$, and z is sufficient to balance a charge of said formula by providing sufficient oxygen anion to balance a positive charge from the Sr, Bi, and Ta cations.

10. A ferroelectric device as in claim 9, wherein said layered superlattice material compound includes strontium bismuth tantalate and a dopant selected from the group consisting of calcium, barium, cadmium, lead, titanium, hafnium, tungsten, niobium, zirconium, scandium, yttrium, lanthanum, antimony, chromium, and thallium.

11. A ferroelectric device as in claim 10, wherein said dopant includes a B-site metal selected from the group consisting of hafnium and tungsten.

* * * * *

UNITED STATES PATENT AND TRADEMARK OFFICE
CERTIFICATE OF CORRECTION

PATENT NO. : 6,072,207
DATED : June 6, 2000
INVENTOR(S) : Hiroyuki Yoshimori, et al.

Page 1 of 1

It is certified that error appears in the above-identified patent and that said Letters Patent is hereby corrected as shown below:

Column 28,
Line 41, replace "$c \leq 1.0$, and $(c \div w) \geq 1$." with -- $c \geq 1.0$, and $(c \div w) > 1$ --.

Signed and Sealed this

Seventh Day of August, 2001

Attest:

NICHOLAS P. GODICI
Attesting Officer   Acting Director of the United States Patent and Trademark Office